United States Patent
Kim et al.

(10) Patent No.: US 11,095,318 B2
(45) Date of Patent: Aug. 17, 2021

(54) TRANSCEIVER USING ACTIVE DEVICE ARRAY AND ANTENNA MODULE INCLUDING THE SAME

(71) Applicant: SAMSUNG ELECTRONICS CO., LTD., Suwon-si (KR)

(72) Inventors: Youngmin Kim, Suwon-si (KR);
Hongjong Park, Seoul (KR);
Daeyoung Yoon, Yongin-si (KR);
Sunwoo Lee, Suncheon-si (KR);
Youngki Lee, Suwon-si (KR); Dooseok Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/743,478

(22) Filed: Jan. 15, 2020

(65) Prior Publication Data
US 2021/0028797 A1    Jan. 28, 2021

(30) Foreign Application Priority Data
Jul. 24, 2019    (KR) .......................... 10-2019-0089796

(51) Int. Cl.
*H04N 1/44*    (2006.01)
*H04B 1/00*    (2006.01)
(Continued)

(52) U.S. Cl.
CPC ....... *H04B 1/005* (2013.01); *H01L 23/49822* (2013.01); *H01Q 21/0025* (2013.01); *H05K 1/0243* (2013.01)

(58) Field of Classification Search
CPC ... H04B 1/40; H04B 1/18; H04B 1/48; H04B 1/005; H04B 1/04; H04B 2001/0408;
(Continued)

(56) References Cited

U.S. PATENT DOCUMENTS 7,146,136 B2   12/2006   Consolazio
7,498,549 B2    3/2009   Gallivan et al.
(Continued)

FOREIGN PATENT DOCUMENTS

JP    2003-283211 A    10/2003

OTHER PUBLICATIONS

Communication dated Oct. 9, 2020 by the European Patent Office in counterpart European Patent Application No. 20163318.7.

*Primary Examiner* — Nhan T Le
(74) *Attorney, Agent, or Firm* — Sughrue Mion, PLLC

(57) ABSTRACT

An antenna module includes a multilayer board, a radio frequency (RF) chip, and a first active device array. The multilayer board includes an antenna that transmits and receives electromagnetic waves. The RF chip is on a bottom surface of the multilayer board, and includes transmission circuits each of which constitutes a part of each of transmission paths for generating RF signals to be provided to the antenna. The first active device array is on the bottom surface of the multilayer board, and includes a first group of active devices respectively included in a portion of power amplifiers in the transmission paths of the transmission circuits, and first input pins and first output pins respectively connected to electrodes of the first group of active devices.

15 Claims, 25 Drawing Sheets

(51) Int. Cl.
*H01L 23/498* (2006.01)
*H01Q 21/00* (2006.01)
*H05K 1/02* (2006.01)

(58) Field of Classification Search
CPC ...... H01L 2223/6677; H01L 23/49822; H01C 1/2283; H01Q 21/0025; H05K 1/0243
See application file for complete search history.

(56) References Cited

U.S. PATENT DOCUMENTS

| | | |
|---|---|---|
| 8,107,894 B2 | 1/2012 | Lowell et al. |
| 8,279,008 B2 | 10/2012 | Hsieh et al. |
| 9,031,518 B2 | 5/2015 | Lin |
| 2003/0143971 A1 | 7/2003 | Hongo et al. |
| 2008/0125061 A1* | 5/2008 | Kuriyama ............... H03F 3/195 455/127.1 |
| 2012/0163247 A1 | 6/2012 | Shimamoto et al. |
| 2014/0320212 A1* | 10/2014 | Kalantari ................ H03F 1/34 330/294 |
| 2018/0287266 A1* | 10/2018 | Madsen .................. H01Q 3/36 |
| 2018/0316383 A1 | 11/2018 | Kamgaing et al. |
| 2018/0343027 A1* | 11/2018 | Kuo ........................ H03F 3/265 |
| 2018/0375543 A1 | 12/2018 | Betti-Berutto et al. |
| 2019/0052300 A1 | 2/2019 | Margomenos |

\* cited by examiner

TRANSCEIVER USING ACTIVE DEVICE ARRAY AND ANTENNA MODULE INCLUDING THE SAME

CROSS-REFERENCE TO RELATED APPLICATION

This application claims priority to Korean Patent Application No. 10-2019-0089796, filed on Jul. 24, 2019, in the Korean Intellectual Property Office, the disclosure of which is incorporated by reference herein in its entirety.

BACKGROUND

1. Field

The present disclosure relates to wireless communication, and more particularly, to a transceiver for wireless communication and an antenna module including the transceiver.

2. Description of the Related Art

In order to increase the data throughput in wireless communication, an extended frequency band may be used, and thus a wireless communication device may require an ability to process high frequency signals. For example, the 5G millimeter wave (mmWave) frequency allocation distributed by a 3rd Generation Partnership Project (3GPP) may include a high frequency band of 20 GHz or higher. In order to better process such high frequency signals, a high performance transceiver may be included in the wireless communication device.

In addition to the high performance, the transceiver may be required to have high availability such as low cost, low power consumption, low operating temperature, high stability, and the like, and in particular, the transceiver included in a portable wireless communication device such as a mobile phone may be required to have much higher availability due to limited space, temperature, and power.

SUMMARY

It is an aspect to provide a transceiver and an antenna module including the transceiver that may provide high performance as well as high availability.

According to an aspect of an example embodiment, there is provided a radio frequency (RF) chip configured to process an RF signal, the RF chip including an input/out pin for connecting to an antenna; a first output pin and a first input pin for respectively connecting to electrodes of a first active device included in a first active device array; and a transmission circuit constituting a part of a transmission path for generating the RF signal to be provided to the antenna, wherein the transmission path sequentially passes through the first output pin, the first active device, and the first input pin.

According to another aspect of an example embodiment, there is provided an antenna module including a multilayer board including an antenna configured to transmit and receive electromagnetic waves through an upper surface of the multilayer board; a radio frequency (RF) chip connected to the antenna and configured to process an RF signal on a bottom surface of the multilayer board; and a first active device array including a plurality of active devices, and a first input pin and a first output pin respectively connected to electrodes of a first active device of the plurality of active devices, wherein the multilayer board includes a first pattern for a first signal to be provided from the RF chip to the first input pin; and a second pattern for a second signal to be provided from the first output pin to the RF chip.

According to another aspect of an example embodiment, there is provided an antenna module including a first active device array, the antenna module including a multilayer board comprising at least one antenna configured to transmit and receive electromagnetic waves; a radio frequency (RF) chip on a bottom surface of the multilayer board, the RF chip comprising a plurality of transmission circuits each of which constitutes a part of each of a plurality of transmission paths for generating a plurality of RF signals to be provided to the at least one antenna; and a first active device array on the bottom surface of the multilayer board, the first active device array comprising a first group of active devices respectively included in at least a portion of a plurality of power amplifiers in the plurality of transmission paths of the plurality of transmission circuits, and a plurality of first input pins and a plurality of first output pins respectively connected to electrodes of the first group of active devices.

BRIEF DESCRIPTION OF THE DRAWINGS

Embodiments will be more clearly understood from the following detailed description taken in conjunction with the accompanying drawings in which.

DETAILED DESCRIPTION

The drawings may not be to scale, and may exaggerate or reduce the components shown for convenience of illustration. In the present specification, the phrase "at least one of A and B" includes within its scope "only A", "only B", and "both A and B".

Figure 1:
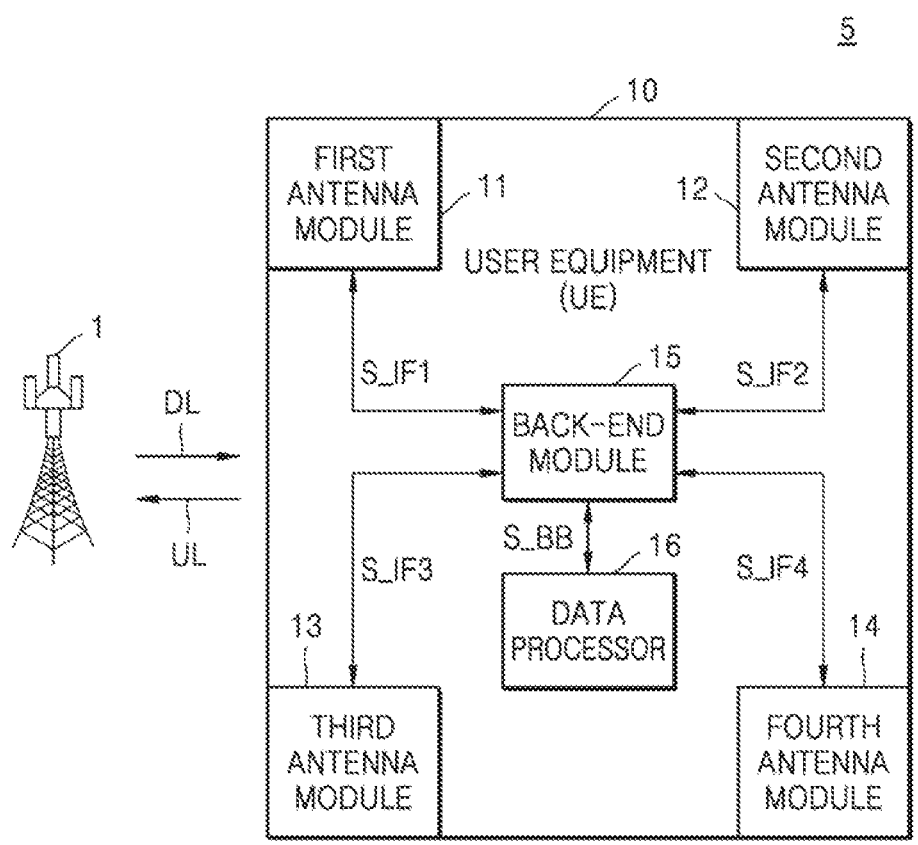
FIG. 1 illustrates a wireless communication system in accordance with an example embodiment.

FIG. 1 illustrates a wireless communication system 5 in accordance with an example embodiment. As a non-limiting example, the wireless communication system 5 may include a wireless communication system using a cellular network such as a $5^{th}$ generation wireless (5G) system, a long term evolution (LTE) system, an LTE-Advanced system, a code division multiple access (CDMA) system, or a global system for mobile communications (GSM) system, a wireless personal area network (WPAN) system, or any other wireless communication system. Hereinafter, the wireless communication system 5 will be mainly described with reference to the wireless communication system using the cellular network. However, it will be understood that the example embodiments are not limited thereto.

A base station BS 1 may generally refer to a fixed station that communicates with a user equipment and/or another base station, and may switch data and control information by communicating with the user equipment and/or another base station. For example, the base station 1 may be referred to as a node B, an evolved-node B (eNB), a next generation node B (gNB), a sector, a site, a base transceiver system (BTS), an access point (AP), a relay node, a remote radio head (RRH), a radio unit (RU), a small cell, or the like. In the current specification, a BS or a cell may be comprehensively understood as a partial region or function covered by a base station controller (BSC) in CDMA, a node-B of WCDMA, an eNB in LTE, a gNB of 5G, a sector (a site), and the like, and may cover various coverage regions such as megacell, macrocell, microcell, picocell, femtocell, relay node, RRH, RU, and small cell communication range, and the like.

The user equipment UE 10 may be fixed or movable and may refer to arbitrary equipment that may transmit and receive data and/or control information by communicating with a base station, for example, the base station 1. For example, the user equipment 10 may be referred to as a terminal, a terminal equipment, a mobile station (MS), a mobile terminal (MT), a user terminal (UT), a subscriber station (SS), a wireless device, or a handheld device, and the like. Hereinafter, example embodiments will be described with reference to the user equipment 10 as a wireless communication device. However, it will be understood that the example embodiments are not limited thereto.

A wireless communication network between the user equipment 10 and the base station 1 may support a plurality of users to communicate with each other by sharing available network resources. For example, in the wireless communication network, information may be transmitted by various multiple access methods such as code division multiple access (CDMA), frequency division multiple access (FDMA), time division multiple access (TDMA), orthogonal frequency division multiple access (OFDMA), single carrier frequency division multiple access (SC-FDMA), orthogonal frequency division multiple-frequency division multiple access (OFDM-FDMA), orthogonal frequency division multiple-time division multiple access (OFDM-TDMA), and orthogonal frequency division multiple-code division multiple access (OFDM-CDMA). As shown in FIG. 1, the user equipment 10 may communicate with the base station 1 through an uplink (UL) and a downlink (DL). In some embodiments, user equipment may communicate with each other through a sidelink such as a device-to-device (D2D). As shown in FIG. 1, the user equipment 10 may include a first antenna module 11, a second antenna module 12, a third antenna module 13, and a fourth antenna module 14, a back-end module 15, and a data processor 16. In some embodiments, the first to fourth antenna modules 11 to 14 may be packaged independently and spaced apart from each other. In some embodiments, the back-end module 15 and the data processor 16 may be packaged independently of each other or may be packaged collectively.

Each of the first to fourth antenna modules 11 to 14 may include at least one antenna and may process a signal received through the antenna and a signal to be transmitted through the antenna. In some embodiments, the first to fourth antenna modules 11 to 14 may generate or process first to fourth intermediate frequency (IF) signals (S_IF1 to S_IF4). For example, the first antenna module 11 may generate the first IF signal S_IF1 from an RF signal received through the antenna and process the first IF signal S_IF1 provided from the back-end module 15 to output the generated RF signal through the antenna. Similarly, the second antenna module 12 may generate the second IF signal S_IF2 from an RF signal received through the antenna and process the second IF signal S_IF2 provided from the back-end module 15 to output the generated RF signal through the antenna, and so on. In some embodiments, each of the first to fourth antenna modules 11 to 14 may be referred to as a front-end module or an RF module. Structures of the first to fourth antenna modules 11 to 14 will be illustrated below with reference to FIG. 2.

In a high frequency band such as millimeter wave (mm-Wave), a signal with a short wavelength may have high straightness, and thus communication quality may be influenced by interruption by obstacles and/or a direction of an antenna. The user equipment 10 may include a plurality of antenna modules, for example, the first to fourth antenna modules 11 to 14, such that it is possible to communicate with the base station 1 although transmission and reception of signals through some antenna modules may be blocked by an obstacle such as a user's body, and/or it is possible to communicate with the base station 1 in spite of a direction of the user equipment 10. As illustrated in FIG. 1, the first to fourth antenna modules 11 to 14 included in the user equipment 10 may be provided apart from each other, and in some embodiments, the first to fourth antenna modules 11 to 14 may be spaced apart from each other at edges of the user equipment 10. FIG. 1 shows four antenna modules. However, in some embodiments, the number of antenna modules in the user equipment 10 may be different and may be more or less than a number of antenna modules shown in FIG. 1.

As the performance required for an antenna module increases, the complexity of the antenna module may increase, and requirements for the implementation of the antenna module, such as space, power, and cost, may increase. Furthermore, as described above, since the user equipment 10 may include a plurality of antenna modules, the increasing of the requirements for the implementation of the antenna module may be a high burden on the user equipment 10. As described below with reference to the drawings, according to various example embodiments, each of the first to fourth antenna modules 11 to 14 may include an active device array, and thus, a transceiver may provide improved performance, such as high output current and high linearity, by using active devices included in the active device array, and also may provide improved efficiency, such as small space and low cost, by using passive devices having high integration. Moreover, each of the first to fourth antenna modules 11 to 14 may provide high stability by separating active devices that function as significant heat sources.

The back-end module 15 may process or generate a baseband signal S_BB. For example, the back-end module 15 may generate at least one of the first to fourth IF signals S_IF1 to S_IF4 by processing the baseband signal S_BB provided from the data processor 16 and may generate the baseband signal S_BB by processing at least one of the first to fourth IF signals S_IF1 to S_IF4. In some embodiments, differently from that shown in FIG. 1, the first to fourth antenna modules 11 to 14 may respectively generate baseband signals and provide the baseband signals to the data processor 16, and in this case, the back-end module 15 may be omitted.

The data processor 16 may extract information to be transmitted by the base station 1 from the baseband signal S_BB, which is received from the back-end module 15, and may also generate the baseband signal S_BB including information to be transmitted to the base station 1. The data processor 16 may include a hardware block designed through logic synthesis, or may include a processing block including a software module including a series of commands and one or more processors such as a microprocessor or a central processing unit (CPU) executing the software module. The hardware block and/or the processing block of the data processor 16 may be the same as or different than that of the back-end module 15. The data processor 16 may be referred to as a communication processor, a baseband processor, a modem, or the like.

Figure 2:
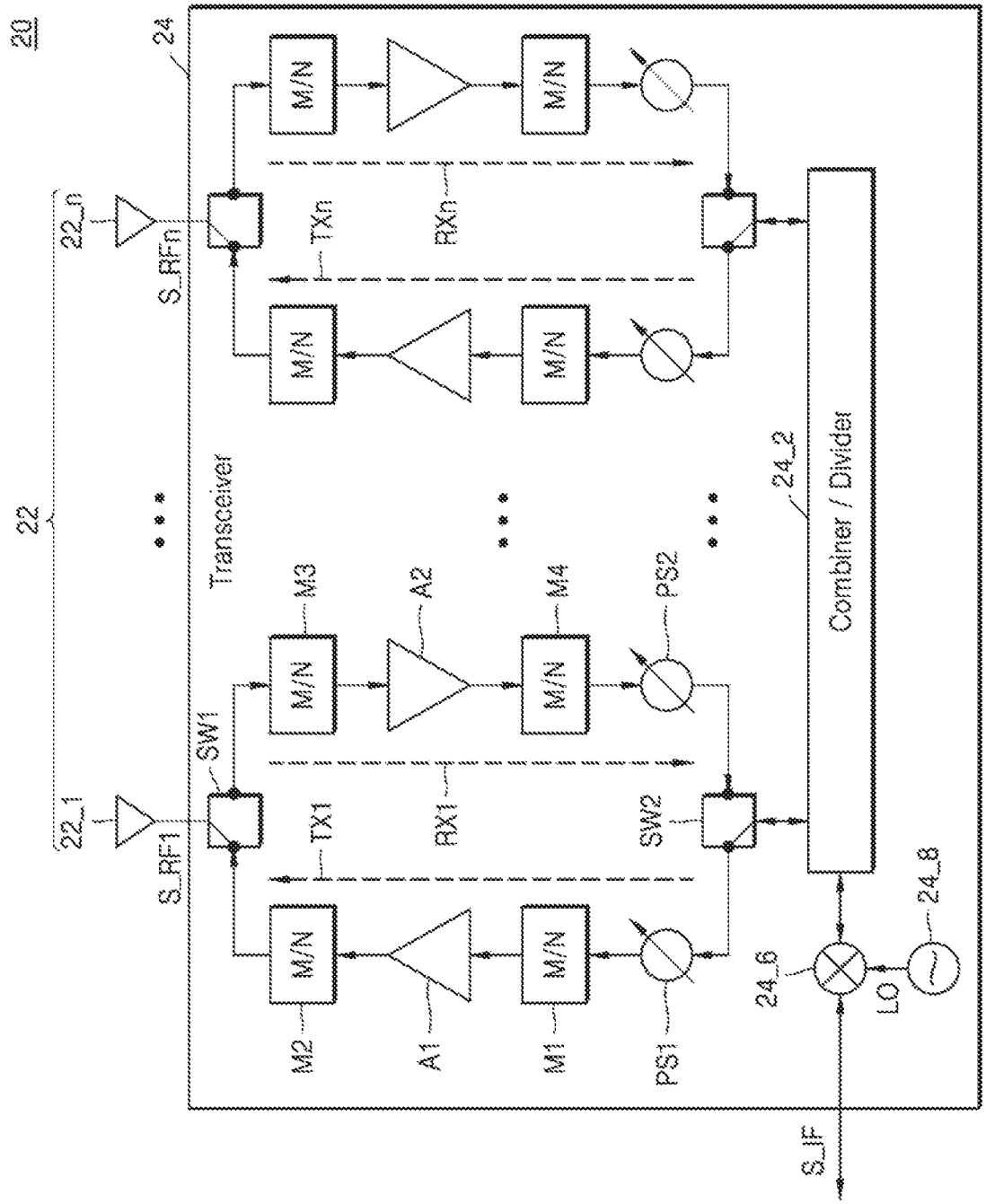
FIG. 2 illustrates an antenna module in accordance with an example embodiment.

FIG. 2 illustrates an antenna module 20 in accordance with an example embodiment. As shown in FIG. 2, the antenna module 20 may include first to n-th antennas 22_1 to 22_n and a transceiver 24 (n is an integer greater than 1). As described above with reference to FIG. 1, the antenna module 20 may output first to n-th RF signals S_RF1 to S_RFn to the first to n-th antennas 22_1 to 22_n, or may receive the first to n-th RF signals S_RF1 to S_RFn from the first to n-th antennas 22_1 to 22_n, and also may generate or receive an IF signal S_IF. The antenna module 20 of FIG. 2 may be an example of each of the first to fourth antenna modules 11 to 14 of FIG. 1, and FIG. 2 will be described below with reference to FIG. 1.

The first to n-th antennas 22_1 to 22_n may be used, as a non-limiting example, in spatial diversity, polarization diversity, spatial multiplexer, beamforming, or the like. Each of the first to n-th antennas 22_1 to 22_n may include any type of antenna, for example, a patch antenna, a dipole antenna, or the like. As shown in FIG. 2, a transceiver 24 may include circuits respectively corresponding to the first to n-th antennas 22_1 to 22_n, and include a combiner/divider 24_2, a mixer 24_6, and a local oscillating generator 24_8.

In the transceiver 24, n transmission paths and n reception paths corresponding to the first to n-th antennas 22_1 to 22_n may be formed. For example, as illustrated in FIG. 2, a first transmission path TX1 and a first reception path RX1 corresponding to the first antenna 22_1 may be formed, and an n-th transmission path TXn and an n-th reception path RXn may be formed corresponding to the n-th antenna 22_n. In addition, in some example embodiments, the transceiver 24 may include a first switch SW1 and a second switch SW2 corresponding to each of the first to n-th antennas 22_1 to 22_n such that the first transmission path TX1 is selected in a transmission mode and the first reception path RX1 is selected in a reception mode. The first and second switches SW1 and SW2 of FIG. 2 may indicate a state in which the first transmission path TX1 is selected in the transmission mode. In some embodiments, as described below with reference to FIG. 8A and the like, two or more transmission paths and two or more reception paths corresponding to one antenna may be formed in the transceiver 24, such that two or more RF signals differently polarized from the one antenna are output.

The combiner/divider 24_2 may provide a signal up-converted from the IF signal S_IF by a local oscillating signal LO provided by the local oscillating generator 24_8 to the first to n-th transmission paths TX1 to TXn in the transmission mode. In the other hand, in the reception mode, the combiner/divider 24_2 may provide at least some of the signals received from the first to n-th reception paths RX1 to RXn or combinations thereof to the mixer 24_6. The mixer 24_6 may perform up-conversion or down-conversion according to the local oscillating signal LO. The local oscillating generator 24_8 may generate the local oscillating signal LO based on a carrier frequency, or the like, and in some embodiments, may include a phased locked loop (PLL).

The transmission path may include a transmission circuit. For example, as shown in FIG. 2, the transmission circuit constituting the first transmission path TX1 may include a first phase shifter PS1, a first matching network (M/N) M1, a first amplifying circuit A1, and a second matching network (M/N) M2. In addition, the transmission circuit may include a power amplifier. For example, the power amplifier may include the first matching network (M/N) M1, the first amplifying circuit A1 and the second matching network (M/N) M2. Similarly, the reception path may include a reception circuit. For example, as shown in FIG. 2, the reception circuit constituting the first reception path RX1 may include a third matching network (M/N) M3, a second amplifying circuit A2, a fourth matching network (M/N) M4, and a second phase shifter PS2. In addition, the reception circuit may include a low noise amplifier. For example, the low noise amplifier may include the third matching network (M/N) M3, the second amplifying circuit A2 and the fourth matching network (M/N) M4. In some embodiments, some of components shown in FIG. 2 that constitute the transmission path and/or the reception path may be omitted, or the components may be disposed differently than those shown in FIG. 2. Hereinafter, for simplicity of description, example embodiments will be described mainly with reference to the first transmission path TX1 and the first reception path RX1 corresponding to the first antenna 22_1.

The transmission circuit and the reception circuit may include an active device such as a transistor, for example, and may also include a passive device such as a capacitor, an inductor, or the like. For example, in the transmission circuit constituting the first transmission path TX1, the first amplifying circuit A1 may include at least one transistor as an active device, while the first and second matching networks (M/N) M1 and M2 each may include at least one capacitor and/or at least one inductor. As described above with reference to FIG. 1, the transmission circuit and the reception circuit may be required to meet high performance as well as high availability.

Components included in the transceiver 24 may be manufactured by a semiconductor process. In one example, when the transceiver 24 is manufactured as a single chip by a complementary metal oxide semiconductor (CMOS) process, the transceiver 24 may provide low cost and high integration, while the transceiver 24 may provide relatively low output power capability, low linearity and weak breakdown characteristics. Furthermore, a fully depleted silicon on insulator (FD-SOI) process may provide lower leakage power and heat generation than a bulk silicon process. In another example, when the transceiver 24 is manufactured as a single chip by a BiCMOS process such as a SiGe BiCMOS (Bipolar-CMOS) process, the transceiver 24 may provide higher output power capability compared to a transceiver manufactured by the CMOS process, while the transceiver 24 may have a higher cost than a transceiver manufactured by the CMOS process. In another example, when the transceiver 24 is manufactured as a single chip by a III-V compound semiconductor process such as a GaAs compound semiconductor process, the transceiver 24 may provide higher output power capability and linearity than a transceiver manufactured by the CMOS and/or BiCMOS processes described above, while the transceiver 24 may have a higher cost as well as occupy a larger area than a transceiver manufactured by the CMOS and/or BiCMOS processes described above due to low density.

In some example embodiments, the transceiver 24 may include two or more chips manufactured in different semiconductor processes. For example, the combiner/divider 24_2, the mixer 24_6 and the local oscillating generator 24_8 may be included in a chip manufactured in the CMOS process that may provide high integration, while the remaining components of the transceiver 24, including the transmission circuit and the reception circuit, may be included in a chip manufactured in a semiconductor process that may provide higher performance, such as a BiCMOS or a III-V compound semiconductor process. However, even in this case, the transceiver 24 may still have advantages and disadvantages described above. In addition, when only the transmission circuit that requires higher performance than the reception circuit is included in a chip manufactured in a semiconductor process, such as the III-V compound semiconductor process, which is different from the CMOS process, it may not be easy to integrate passive devices therein due to a limited number of layers and dielectric materials, and consequently, the chip containing the transmission circuit may be enlarged.

According to an example embodiment, as described below with reference to FIGS. 3A and 3B, and the like, the transceiver 24 may include a chip including at least some of active devices included in the transmission circuit and/or the reception circuit (which may be referred to herein as an active device array) and a chip including other components including passive devices (which may be referred to herein as an RF chip). The active device array may be manufactured by the semiconductor process, such as the III-V compound semiconductor process, that may provide higher performance than the CMOS process (e.g., the FD-SOI process), while the RF chip may be manufactured by the CMOS process that may provide high integration and low cost. Accordingly, the transceiver 24 may provide high availability while providing high performance. In the following drawings, for convenience of description, it is assumed that the first amplifying circuit A1 constituting the first transmission path TX1 and the second amplifying circuit A2 constituting the first reception path RX1 may include only the active device such as a transistor.

Figure 3A:
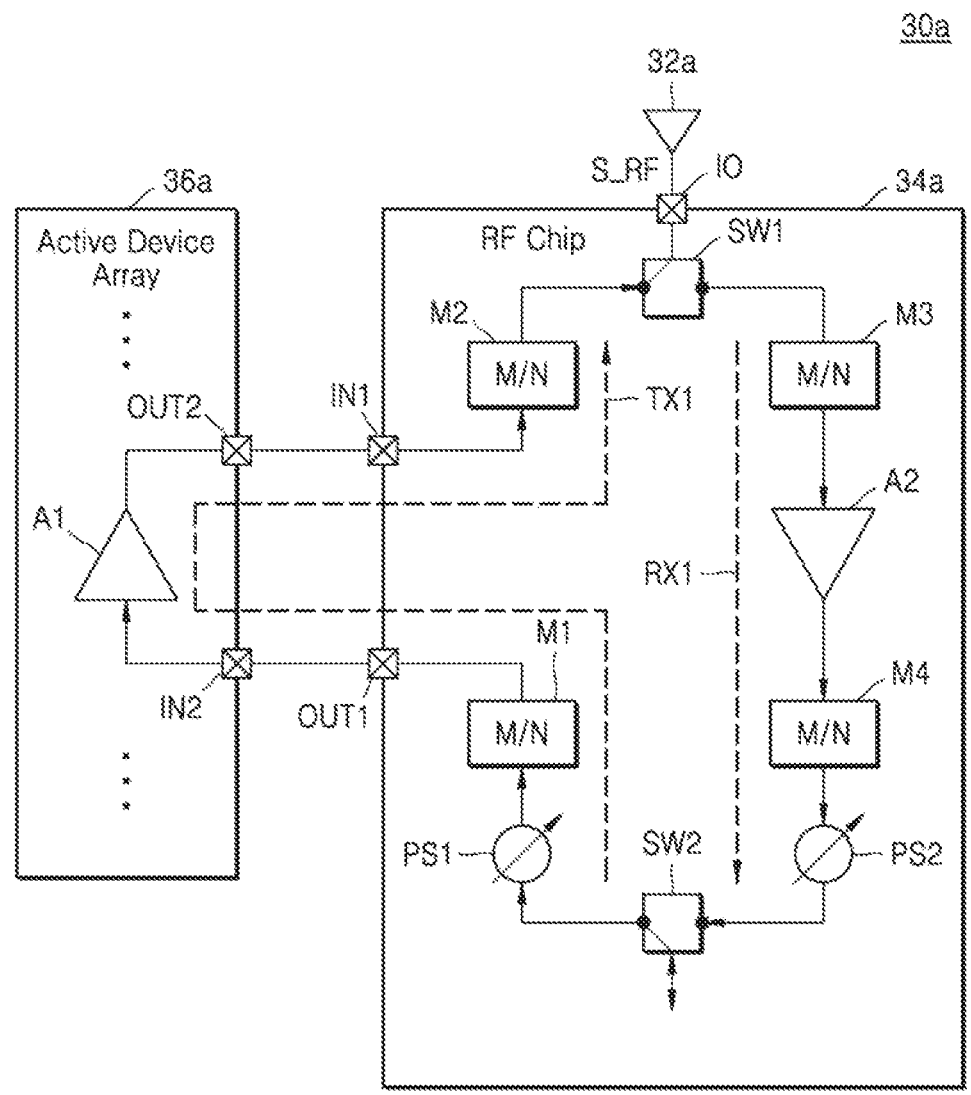
FIGS. 3A and 3B illustrate examples of an antenna module in accordance with example embodiments.
Figure 3B:
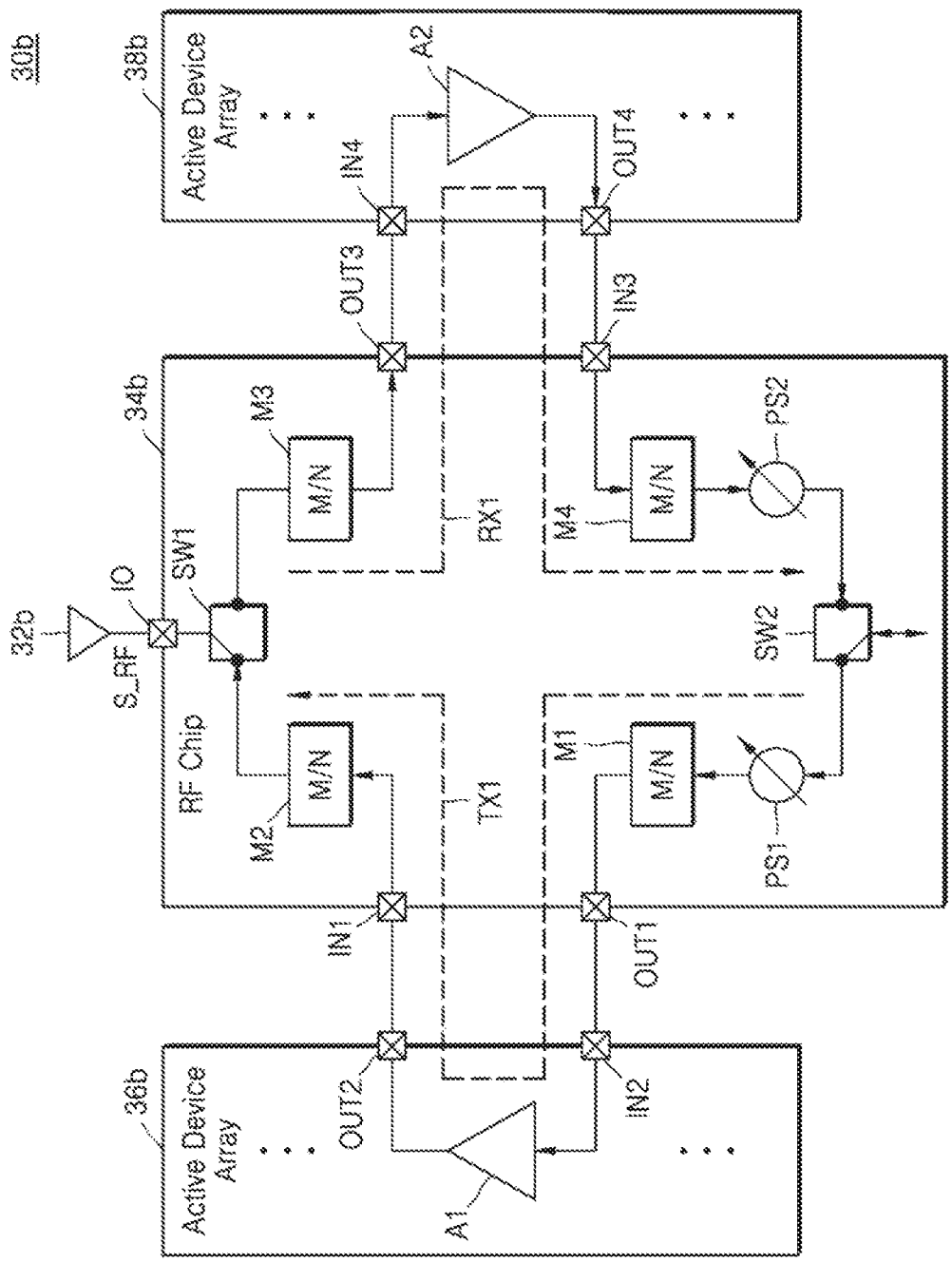

FIGS. 3A and 3B illustrate examples of an antenna module in accordance with example embodiments. Specifically, FIGS. 3A and 3B are block diagrams illustrating one antenna and a transmission circuit and a reception circuit corresponding to the antenna in an antenna module. As described above with reference to FIG. 2, RF chips 34a and 34b in FIGS. 3A and 3B, respectively, may be manufactured in the CMOS process (e.g., the FD-SOI process), while active device array 36a in FIG. 3A, and active device arrays 36b and 38b in FIG. 3B may be manufactured in the semiconductor process, such as the GaAs compound semiconductor process, which may provide higher performance than the CMOS process. Hereinafter, descriptions overlapping with each other regarding FIGS. 3A and 3B and descriptions overlapping with the description of FIG. 2 will be omitted for conciseness.

Referring to FIG. 3A, an antenna module 30a may include an antenna 32a, an RF chip 34a, and an active device array 36a. The RF chip 34a may include a first phase shifter PS1, first and second matching networks (M/N) M1 and M2 as a transmission circuit constituting a first transmission path TX1, and may include a third matching network (M/N) M3, a second amplifying circuit A2, a fourth matching network (M/N) M4, and a second phase shifter PS2 as a reception circuit constituting a first reception path RX1. In addition, the RF chip 34a may include a first switch SW1 and a second switch SW2 for selecting the first transmission path TX1 or the first reception path RX1 according to an operation mode. The RF chip 34a may include pins exposed to the outside of the RF chip 34a, in order to connect to other components. For example, as shown in FIG. 3A, the RF chip 34a may include a first input pin IN1 and a first output pin OUT1 for connecting to the active device array 36a, and include an input/output pin (IO) for connecting to the antenna 32a. The RF chip 34a may be referred to as a radio frequency integrated circuit (RFIC).

The active device array 36a may include a plurality of active devices and may include a plurality of pins connected to electrodes of the plurality of active devices. For example, as shown in FIG. 3A, the active device array 36a may include a first amplifying circuit A1 configured with an active device, and the first amplifying circuit A1 may connect to both a second input pin IN2 and a second output pin OUT2. In some embodiments, the active device included in the active device array 36a may include a high electron mobility transistor (HEMT) which may use a junction between materials having different band gaps (e.g., GaAs) as a channel, whereby the active device may drive a large current with a small control signal and operate well at high frequencies. The active device included in the active device array 36a herein may be referred to as a power cell.

The active device array 36a may include the first amplifying circuit A1 as at least one of the active devices included in the transmission circuit. Accordingly, as shown in FIG. 3A, the first transmission path TX1 may sequentially pass through the first output pin OUT1, the second input pin IN2, the first amplifying circuit A1, the second output pin OUT2, and the first input pin IN1. Accordingly, due to the active device array 36a providing high performance, the first transmission path TX1 may output a good RF signal to the antenna 32a, and at the same time, the increase in the size of the antenna module 30a may be limited due to passive devices included in the RF chip 34a with high integration.

Referring to FIG. 3B, the antenna module 30b may include an antenna 32b, an RF chip 34b, and a first active device array 36b and a second active device array 38b. The RF chip 34b may include a first input pin IN1 and a first output pin OUT1 for connecting to the first active device array 36b and may include a third input pin IN3 and a third output pin OUT3 for connecting to the second active device array 38b. The first active device array 36b may include a first amplifying circuit A1 and may include a second input pin IN2 and a second output pin OUT2 for connecting to the RF chip 34b. The second active device array 38b may include a second amplifying circuit A2 and may include a fourth input pin IN4 and a fourth output pin OUT4 for connecting to the RF chip 34b. In some embodiments, the first and second active device arrays 36b and 38b may be configured as a single chip.

The first active device array 36b may include the first amplifying circuit A1 as at least one of active devices included in the transmission circuit, similar to the active device array 36a of FIG. 3A, and thus the first transmission path TX1, as illustrated in FIG. 3B, may sequentially pass through the first output pin OUT1, the second input pin IN2, the first amplifying circuit A1, the second output pin OUT2, and the first input pin IN1. The second active device array 38b may include the second amplifying circuit A2 as at least one of active devices included in the reception circuit, and thus the first reception path RX1, as illustrated in FIG. 3B, may sequentially pass through the third output pin OUT3, the fourth input pin IN4, the second amplifying circuit A2, the fourth output pin OUT4, and the third input pin IN3. Accordingly, due to the first and second active device arrays 36b and 38b providing high performance, a good RF signal S_RF may be provided to the antenna 32b and the RF signal received from the antenna 32b may be well processed, and at the same time, the increase in the size of the antenna module 30b may be limited due to passive devices included in the RF chip 34b with high integration. In some embodiments, differently from that shown in FIG. 3B, the first active device array 36b may be omitted, and the RF chip 34b may include a first amplifying circuit A1. Alternatively, in some embodiments, differently from that shown in FIG. 3B, the second active device array 38b may be omitted, and the RF chip 34b may include a second amplifying circuit A2.

Figure 4A:
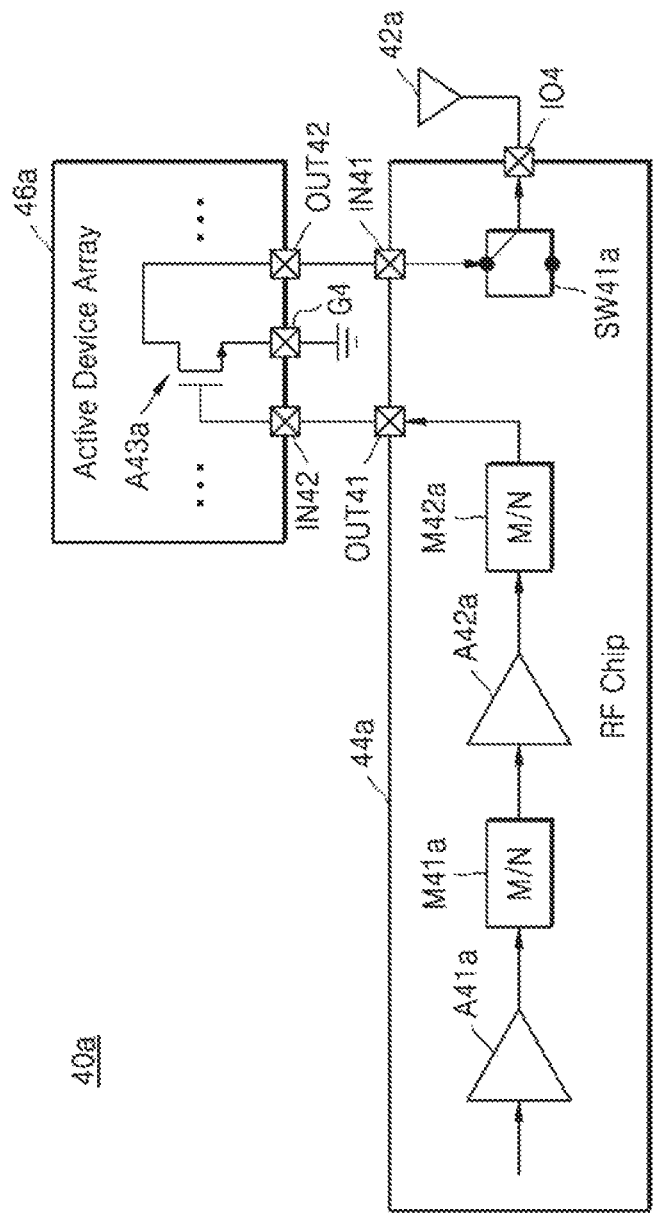
FIGS. 4A and 4B illustrate examples of an antenna module in accordance with example embodiments.
Figure 4B:
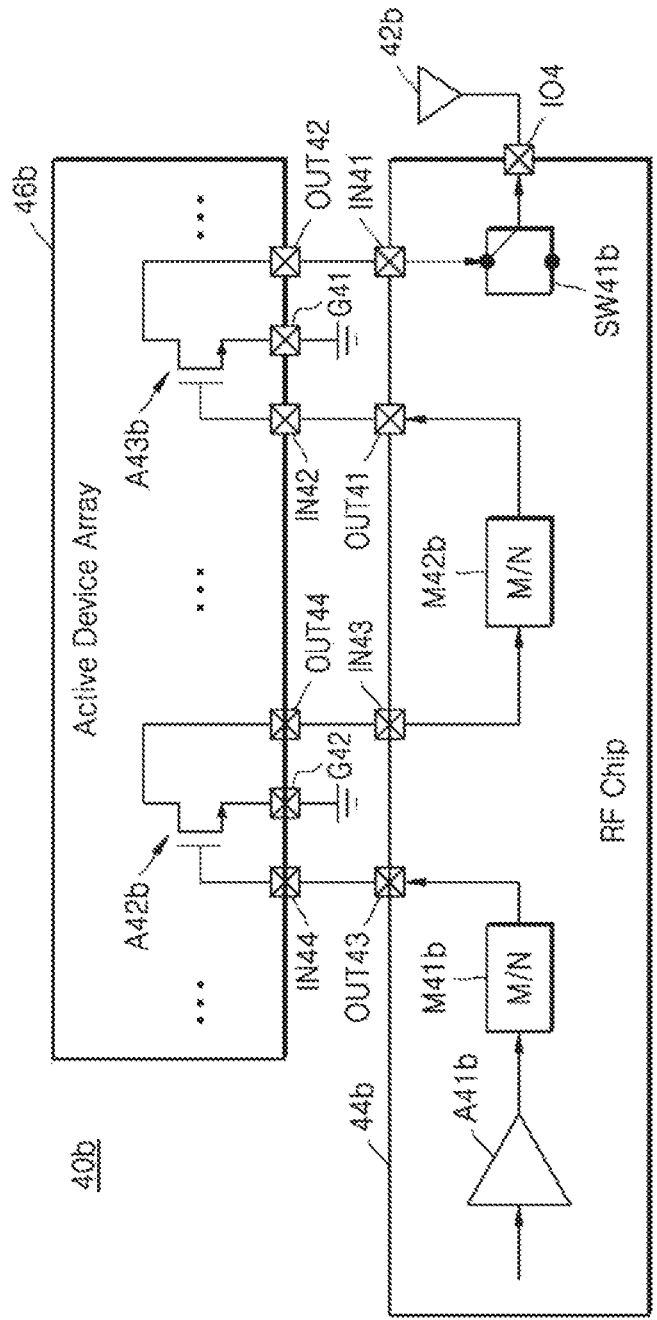

FIGS. 4A and 4B illustrate examples of an antenna module in accordance with example embodiments. Specifically, FIGS. 4A and 4B are block diagrams illustrating one antenna and a portion of a reception circuit corresponding to the antenna in an antenna module. In some embodiments, a power amplifier included in the transmission circuit may be a multi-stage amplifier, and the active device array may include an active device included in one of the stages of the multi-stage amplifier.

Referring to FIG. 4A, an antenna module 40a may include an antenna 42a, an RF chip 44a, and an active device array 46a. In some embodiments, the active device array 46a may include an active device included in a final stage of the multi-stage amplifier. For example, as shown in FIG. 4A, the power amplifier may be a three-stage amplifier, and the RF chip 44a may include a first amplifying circuit A41a and a second amplifying circuit A42a respectively corresponding to the first and second stages, while the active device array 46a may include a third amplifying circuit A43a corresponding to a third stage as the final stage of the multi-stage amplifier. As shown in FIG. 4A, the third amplifying circuit A43a may include a transistor, and the active device array 46a may include a second input pin IN42, a second output pin OUT42, and a ground pin G4 respectively connected to electrodes of the transistor, namely a gate, a drain, and a source, respectively. In some embodiments, the transistor of the active device array 46a may be an HEMT.

The RF chip 44a may include a first matching network (M/N) M41a and a second matching network (M/N) M42a as passive devices disposed between stages of the multi-stage amplifier, and may include a first output pin OUT41 and a first input pin IN41 for connecting to the active device array 46a. In addition, the RF chip 44a may include a switch SW41a for selecting the transmission path or the reception path, and may include an input/output pin 104 for connecting to the antenna 42a.

Referring to FIG. 4B, an antenna module 40b may include an antenna 42b, an RF chip 44b, and an active device array 46b. In some embodiments, the active device array 46b may include active devices respectively included in two or more stages, including a final stage, of the stages of the multi-stage amplifier. For example, as shown in FIG. 4B, the power amplifier may be a three-stage amplifier, and the RF chip 44b may include a first amplifying circuit A41b corresponding to a first stage, while the active device array 46b may include a second amplifying circuit A42b and a third amplifying circuit A43b respectively corresponding to second and third stages. As shown in FIG. 4B, the second and third amplifying circuits A42b and A43b may include transistors, respectively, and the active device array 46b may include a second input pin IN42 and a fourth input pin IN44, a second output pin OUT42 and a fourth output pin OUT44, and a first ground pin G41 and a second ground pin G42 each respectively connected to electrodes of the transistors. In some embodiments, the transistors of the active device array 46b may be HEMTs.

The RF chip 44b may include a first matching network (M/N) M41b and a second matching network (M/N) M42b as passive devices disposed between stages of the multi-stage amplifier, and may include a first input pin IN41 and a third input pin IN43, and a first output pin OUT41 and a third output pin OUT43 for connecting to the active device array 46b. In addition, the RF chip 44b may include a switch SW41b for selecting the transmission path or the reception path, and may include an input/output pin 104 for connecting to the antenna 42b.

Figure 5A:
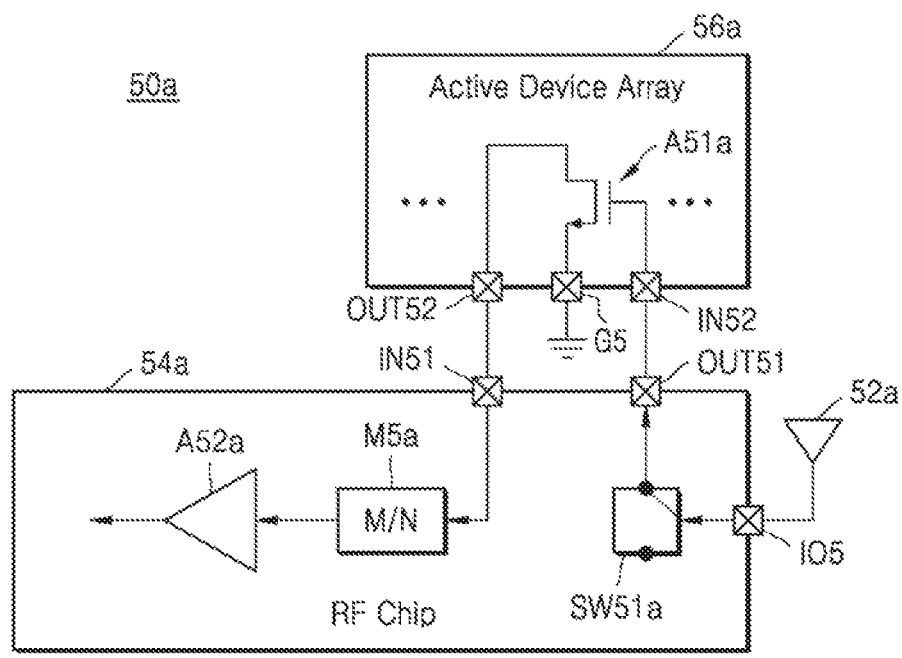
FIGS. 5A and 5B illustrate examples of an antenna module in accordance with example embodiments.
Figure 5B:
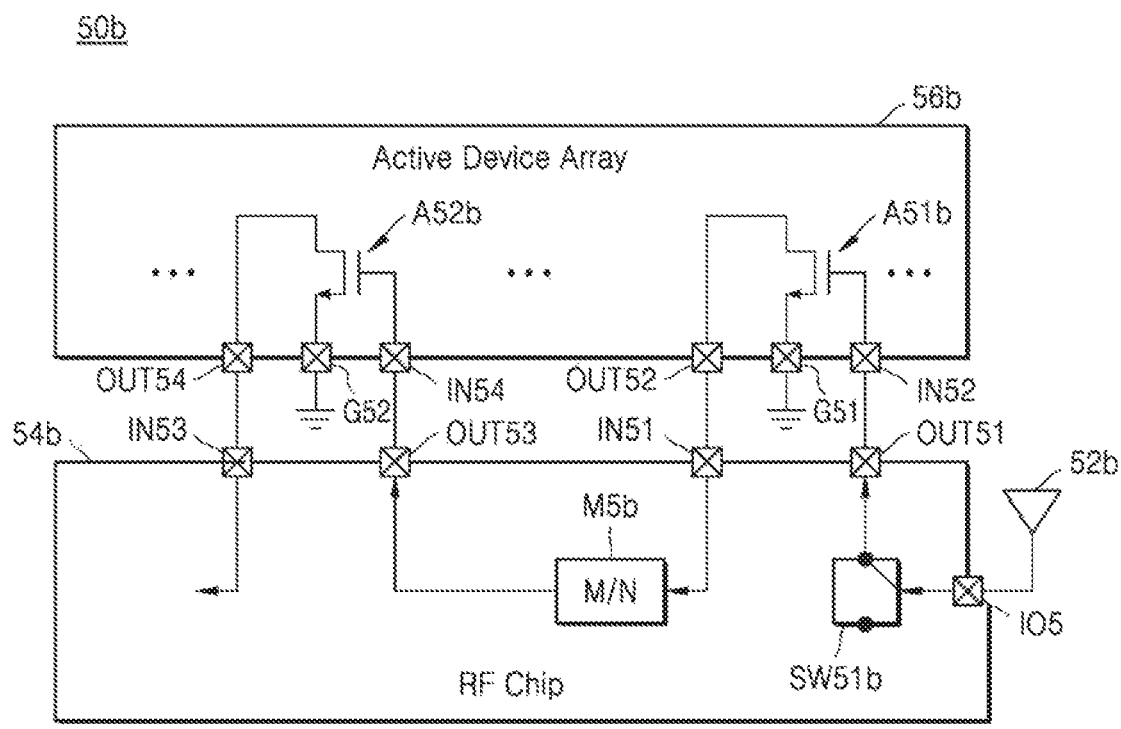

FIGS. 5A and 5B illustrate examples of an antenna module in accordance with example embodiments. Specifically, FIGS. 5A and 5B are block diagrams illustrating one antenna and a portion of a reception circuit corresponding to the antenna in an antenna module. In some embodiments, a low noise amplifier included in the reception circuit may be a multi-stage amplifier, and the active device array may include an active device included in one of the stages of the multi-stage amplifier.

Referring to FIG. 5A, an antenna module 50a may include an antenna 52a, an RF chip 54a, and an active device array 56a. In some embodiments, the active device array 56a may include an active device included in an initial stage of the multi-stage amplifier. For example, as shown in FIG. 5A, the low noise amplifier may include a two-stage amplifier, and the active device array 56a may include a first amplifying circuit A51a corresponding to a first stage as the initial stage of the multi-stage amplifier, while the RF chip 54a may include a second amplifying circuit A52a corresponding to a second stage. As shown in FIG. 5A, the first amplifying circuit A51a may include a transistor, and the active device array 56a may include a second input pin IN52, a second output pin OUT52, and a ground pin G5 respectively connected to electrodes of the transistor, namely a gate, a drain, and a source, respectively. In some embodiments, the transistor of the active device array 56a may be an HEMT.

The RF chip 54a may include a matching network (M/N) M5a as passive devices disposed between stages of the multi-stage amplifier, and may include a first output pin OUT51 and a first input pin IN51 for connecting to the active device array 56a. In addition, the RF chip 54a may include a switch SW51a for selecting the transmission path or the reception path, and may include an input/output pin 105 for connecting to the antenna 52a.

Referring to FIG. 5B, an antenna module 50b may include an antenna 52b, an RF chip 54b, and an active device array 56b. In some embodiments, the active device array 56b may include active devices respectively included in two or more stages, including an initial stage, of the stages of the multi-stage amplifier. For example, as shown in FIG. 5B, the low noise amplifier may be a two-stage amplifier including first and second stages, and the active device array 56b may include a first amplifying circuit A51B and a second amplifying circuit A52b respectively corresponding to the first and second stages. As shown in FIG. 5B, the first and second amplifying circuits A51b and A52b may include transistors, respectively, and the active device array 56b may include a second input pin IN52 and a fourth input pin IN54, a second output pin OUT52 and a fourth output pin OUT54, and a first ground pin G51 and a second ground pin G52 each respectively connected to electrodes of the transistors. In some embodiments, the transistors of the active device array 56b may be HEMTs.

The RF chip 54b may include a matching network (M/N) M5b as passive devices disposed between stages of a multi-stage amplifier, and may include a first input pin IN51 and a third input pin IN53, and a first output pin OUT51 and a third output pin OUT53 for connecting to the active device array 56b. In addition, the RF chip 54b may include a switch SW51b for selecting the transmission path or the reception path, and may include an input/output pin 105 for connecting to the antenna 52b.

Figure 6:
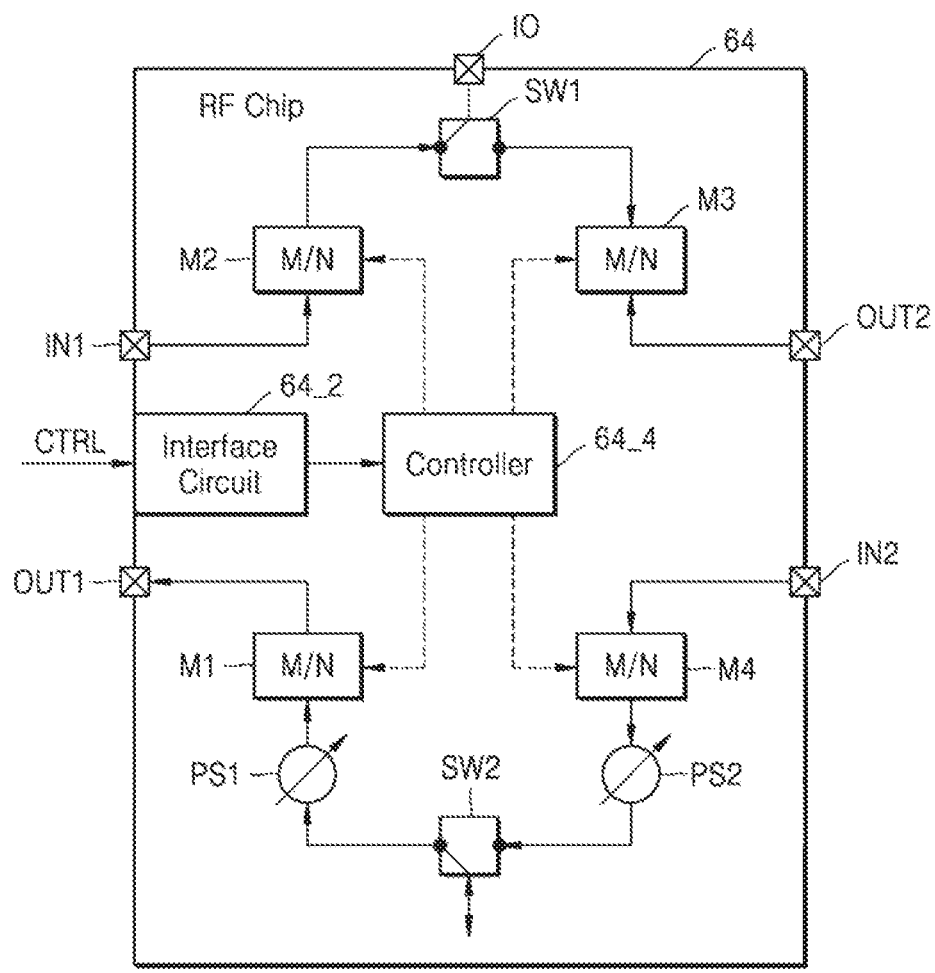
FIG. 6 illustrates a radio frequency (RF) chip in accordance with an example embodiment.

FIG. 6 illustrates an RF chip in accordance with an example embodiment. Specifically, FIG. 6 is a block diagram illustrating an RF chip 64 that includes a tunable matching network. As shown in FIG. 6, the RF chip 64, similar to the RF chip 34b of FIG. 3B, may include a first phase shifter PS1, first and second matching networks (M/N) M1 and M2 included in a transmission circuit, and third and fourth matching networks (M/N) M3 and M4 and a second phase shifter PS2 included in a reception circuit. The RF chip 64 may include first and second switches SW1 and SW2 for selecting the transmission path or the reception path, and may include first and second input pins IN1 and IN2, and first and second output pins OUT1 and OUT2 for connecting to an active device array, and an input/output pin IO for connecting to an antenna.

The RF chip 64 may further include an interface circuit 64_2 and a controller 64_4. The controller 64_4 may include a hardware block designed through logic synthesis, or may include a processing block including a software module including a series of commands and one or more processors such as a microprocessor or a central processing unit (CPU) executing the software module. The interface circuit 64_2 may receive a control signal CTRL from the outside of the RF chip 64 and provide the control signal CTRL or a signal converted therefrom to the controller 64_4. The controller 64_4 may adjust at least one matching parameter of the first to fourth matching networks (M/N) M1 to M4, as indicated by a dashed line in FIG. 6, based on a signal provided from the interface circuit 64_2. For example, matching parameters of the first to fourth matching networks (M/N) M1 to M4 may be adjusted individually according to characteristics of the active device(s) included in the active device array. The matching parameters may thus be the same for each of the matching networks (M/N) M1 to M4, or some or all of the matching parameters may be different from one another. The first to fourth matching networks (M/N) M1 to M4 may include adjustable matching parameters and may include, for example, a passive device having values that are variable under the control of the controller 64_4. It is noted that the term "matching parameters" denotes parameters used for tuning (e.g., impedance matching, etc.) the matching network to the active device(s).

Due to the first to fourth matching networks (M/N) M1 to M4, which are adjustable from the outside of the RF chip 64, various active device arrays may be connected to the RF chip 64. Accordingly, the RF chip 64 may have high availability, and consequently, a reconfigurable antenna module may be used according to a wireless communication device (e.g., 10 of FIG. 1). In some embodiments, the control signal CTRL may be provided from the data processor 16 of FIG. 1. In some embodiments, the controller may be omitted and the control signal CTRL may be provided to the first to fourth matching networks (M/N) M1 to M4 through the interface circuit 64_2.

Figure 7:
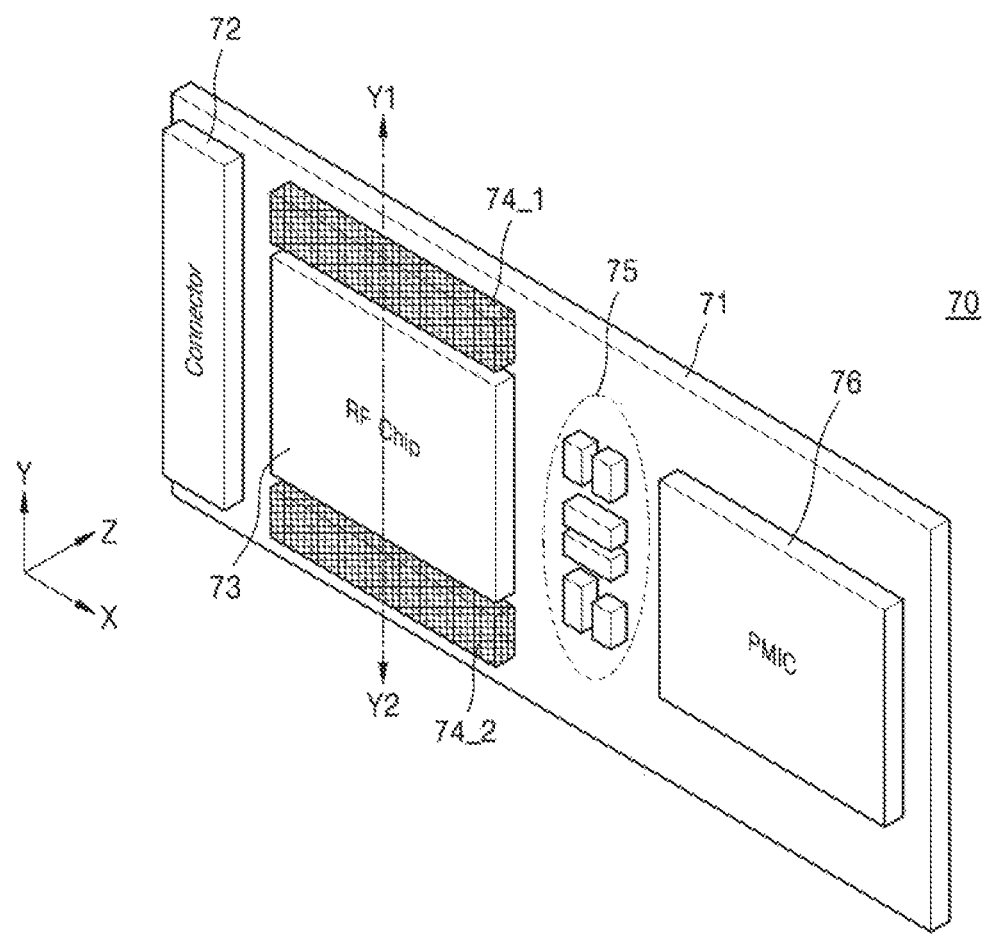
FIG. 7 illustrates an antenna module in accordance with an example embodiment.

FIG. 7 illustrates an antenna module in accordance with an example embodiment. Specifically, FIG. 7 is a perspective view illustrating an antenna module 70 including two active device arrays. Hereinafter, a Z axis direction may be referred to as a vertical direction, and a component disposed in a +Z axis direction relative to the other component may be referred to as being above the other component, and a component disposed in a −Z axis direction relative to the other component may be referred to as being under the other component. In addition, among surfaces of the component, the surface exposed in the +Z axis direction may be referred to as an upper surface of the component, the surface exposed in the −Z axis direction may be referred to as a lower surface of the component, and the surface exposed in a direction perpendicular to the Z axis may be referred to as a side surface of the component. As shown in FIG. 7, the antenna module 70 may include a multilayer board 71, and a connector 72, an RF chip 73, a first active device array 74_1 and a second active device array 74_2, discrete devices 75, and a power management integrated circuit (PMIC) 76 on the lower surface of the multilayer board 71.

The multilayer board 71 may include a plurality of layers, as described below with reference to FIGS. 8A and 8B, and each of the plurality of layers may include the same or different materials, and the plurality of layers may include conductive layers. In some embodiments, the multilayer board 71 may be a printed circuit board (PCB). The multilayer board 71 may include an antenna including a pattern formed on at least one layer, and the antenna may be configured to transmit and receive electromagnetic waves through the upper surface of the multilayer board 71, that is, in the Z axis direction. In addition, the multilayer board 71 may include a pattern for connecting the RF chip 73 (e.g., for connecting the input/output pin IO of the RF chip 34a of FIG. 3A) to the antenna, and may include a pattern for connecting the RF chip 73 to the first and second active device arrays 74_1 and 74_2. Examples of the multilayer board 71 will be described with reference to FIGS. 8A and 8B.

The connector 72 may be coupled with a cable and/or other connector and may provide an interface between the antenna module 70 and an external component. For example, the connector 72 may receive a voltage and/or current for powering the antenna module 70 and transmit the voltage and/or current to the PMIC 76 of the antenna module 70. In addition, the connector 72 may transmit a signal (e.g., the first intermediate signal S_IF1 in FIG. 1) received from the outside of the antenna module 70 to the RF chip 73 and may output a signal (e.g., S_IF1 of FIG. 1) provided from the RF chip 73 to the outside of the antenna module 70.

Each of the first and second active device arrays 74_1 and 74_2 may extend in parallel to an X axis and may be adjacent to edges of the RF chip 73 extending in parallel to the X axis. That is, as shown in FIG. 7, the first and second active device arrays 74_1 and 74_2 may be adjacent to the edges of the RF chip 73 that are opposite to each other in a Y axis direction. The arrangement of the RF chip 73 and the first and second active device arrays 74_1 and 74_2 shown in FIG. 7 may be merely an example, and other examples will be described below with reference to FIGS. 17A to 17C. In some embodiments, the first and second active device arrays 74_1 and 74_2 may be identical, thereby improving the productivity of the antenna module 70.

The discrete devices 75 may include at least one passive device having a relatively large value and/or a relatively high breakdown voltage. For example, the discrete devices 75 may include a bypass (or decoupling) capacitor for a stable power supply voltage. The PMIC 76 may provide power to components of the antenna module 70, such as the RF chip 73, from the power provided through the connector 72. For example, the PMIC 76 may generate at least one power supply voltage and may provide at least one power supply voltage to the RF chip 73 through patterns included in the multilayer board 71.

Figure 8A:
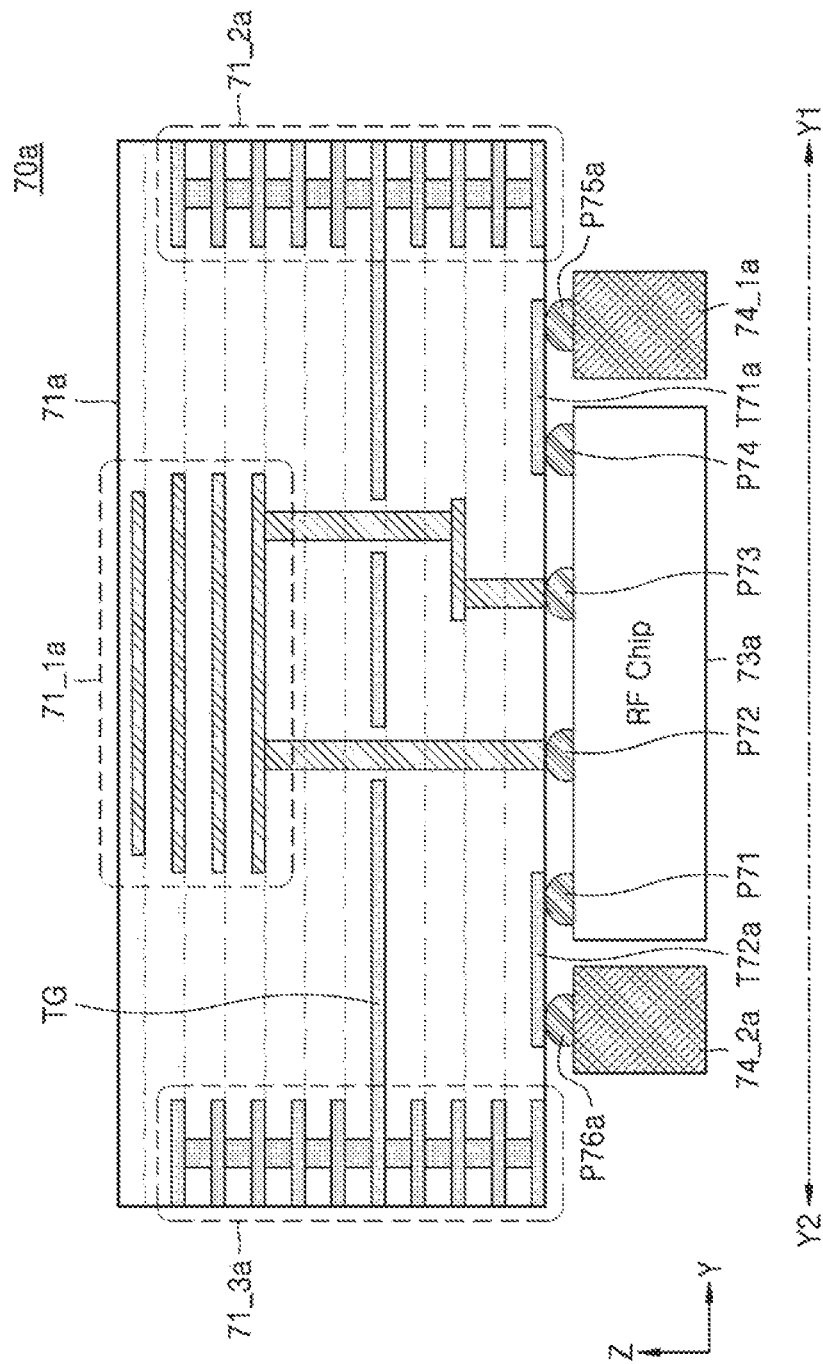
FIGS. 8A and 8B illustrate examples of an antenna module in accordance with example embodiments.
Figure 8B:
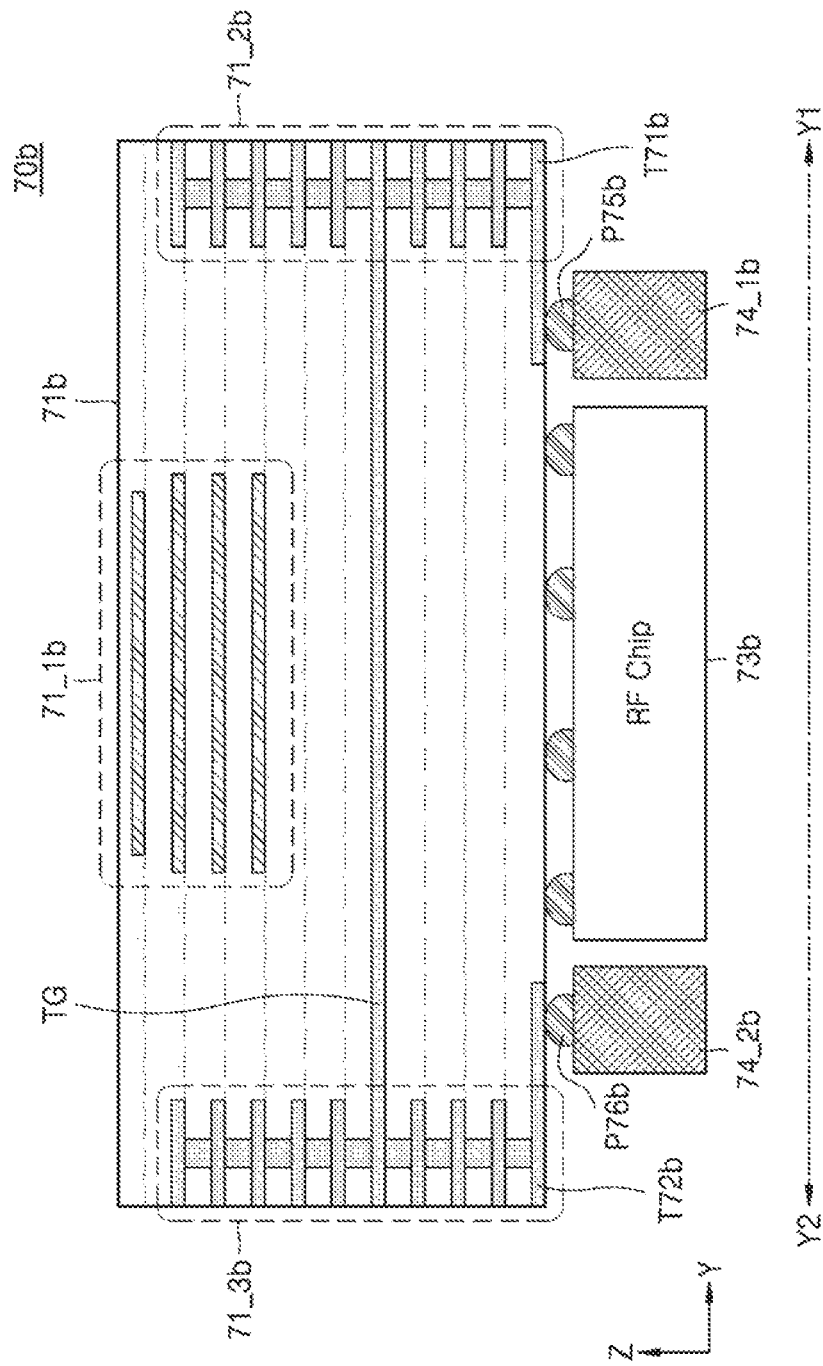

FIGS. 8A and 8B illustrate examples of an antenna module in accordance with example embodiments. Specifically, FIGS. 8A and 8B are cross-sectional views illustrating examples of a cross-section taken along a line Y1-Y2 in a plane perpendicular to the X axis in the antenna module 70 of FIG. 7. Hereinafter, FIGS. 8A and 8B will be described with reference to FIG. 7, and descriptions overlapping with each other and descriptions described with reference to FIG. 7 will be omitted for conciseness.

Referring to FIG. 8A, an antenna module 70a may include a multilayer board 71a, and may include an RF chip 73a, a first active device array 74_1a and a second active device array 74_2a on a bottom surface of the multilayer board 71a. The multilayer board 71a may include a patch antenna 71_1a configured to transmit and receive electromagnetic waves through a top surface of the multilayer board 71a, and the patch antenna 71_1a may include patterns and vias for connecting to a second pin P72 and a third pin P73 of the RF chip 73a, and the second pin P72 and the third pin P73 of the RF chip 73a may be input/output pins. In addition, the multilayer board 71a may include a ground plate TG under the patch antenna 71_1a and may include a first heat dissipation structure 71_2a and a second heat dissipation structure 71_3a. In some embodiments, as shown in FIG. 8A, the first and second heat dissipation structures 71_2a and 71_3a may be connected to the ground plate TG, and thus the first and second heat dissipation structures 71_2a and 71_3a may have a ground potential. In some embodiments, the first and second heat dissipation structures 71_2a and 71_3a may have different shapes than those shown in FIG. 8A and may be disposed differently from those shown in FIG. 8A. Further, the multilayer board 71a may include three or more heat dissipation structures in some embodiments, and in some embodiments, the first and second heat dissipation structures 71_2a and 71_3a may be combined into one structure, e.g., a structure surrounding the patch antenna 71_1a.

The multilayer board 71a may include patterns for connecting the RF chip 73a to the first and second active device arrays 74_1a and 74_2a. For example, as shown in FIG. 8A, the multilayer board 71a may include a first pattern T71a for connecting to a fourth pin P74 of the RF chip 73a and a fifth pin P75a of the first active device array 74_1a, and may include a second pattern T72a for connecting to a first pin P71 of the RF chip 73a and a sixth pin P76a of the second active device array 74_2a. In some embodiments, the first and fourth pins P71 and P74 of the RF chip 73a may be input pins, and the fifth pin P75a of the first active device array 74_1a and the sixth pin P76a of the second active device array 74_2a may be output pins. In some embodiments, the first and fourth pins P71 and P74 of the RF chip 73a may be output pins, and the fifth pin P75a of the first active device array 74_1a and the sixth pin P76a of the second active device array 74_2a may be input pins.

Referring to FIG. 8B, an antenna module 70b may include a multilayer board 71b, and may include an RF chip 73b, a first active device array 74_1b and a second active device array 74_2b on a bottom surface of the multilayer board 71b. The multilayer board 71b may include a patch antenna 71_1b, a ground plate TG, and a first heat dissipation structure 71_2b and a second heat dissipation structure 71_3b.

In some embodiments, the active device array may be directly connected to the heat dissipation structure of the multilayer board. For example, as shown in FIG. 8B, the multilayer board 71b may include a first pattern T71b extending from the first heat dissipation structure 71_2b, and a fifth pin 75b of the first active device array 74_1b may be connected to the first pattern T71b. Similarly, the multilayer board 71b may include a second pattern T72b extending from the second heat dissipation structure 71_3b, and a sixth fin 76b of the second active device array 74_2b may be connected to the second pattern T72b. Compared with a related art configuration in which active devices included in the first and second active device arrays are included in the RF chip, since the first and second active device arrays 74_1b and 74_2b separated from the RF chip 73b may directly connect to the first and second heat dissipation structures 71_2b and 71_3b, the temperature rise of components included in the RF chip 73b, which may be caused by heat generation in the first and second active device arrays 74_1b and 74_2b, may be limited, and the temperature rise of the active devices included in the first and second active device arrays 74_1b and 74_2b may also be limited. Specifically, power consumption and heat generation in a transmission mode may mainly occur in the power amplifier, so that when the first and second active device arrays 74_1b and 74_2b include active devices included in the transmission circuit, the temperature characteristics of the antenna module 70b may be significantly improved. In some embodiments, as shown in FIG. 8B, the first and second heat dissipation structures 71_2b and 71_3b may be connected to the ground plate TG, and a fifth fin P75b of the first active device array 74_1b and a sixth pin P76b of the second active device array 74_2b may be ground pins (e.g., ground pin G4 in the embodiment of FIG. 4A).

Figure 9:
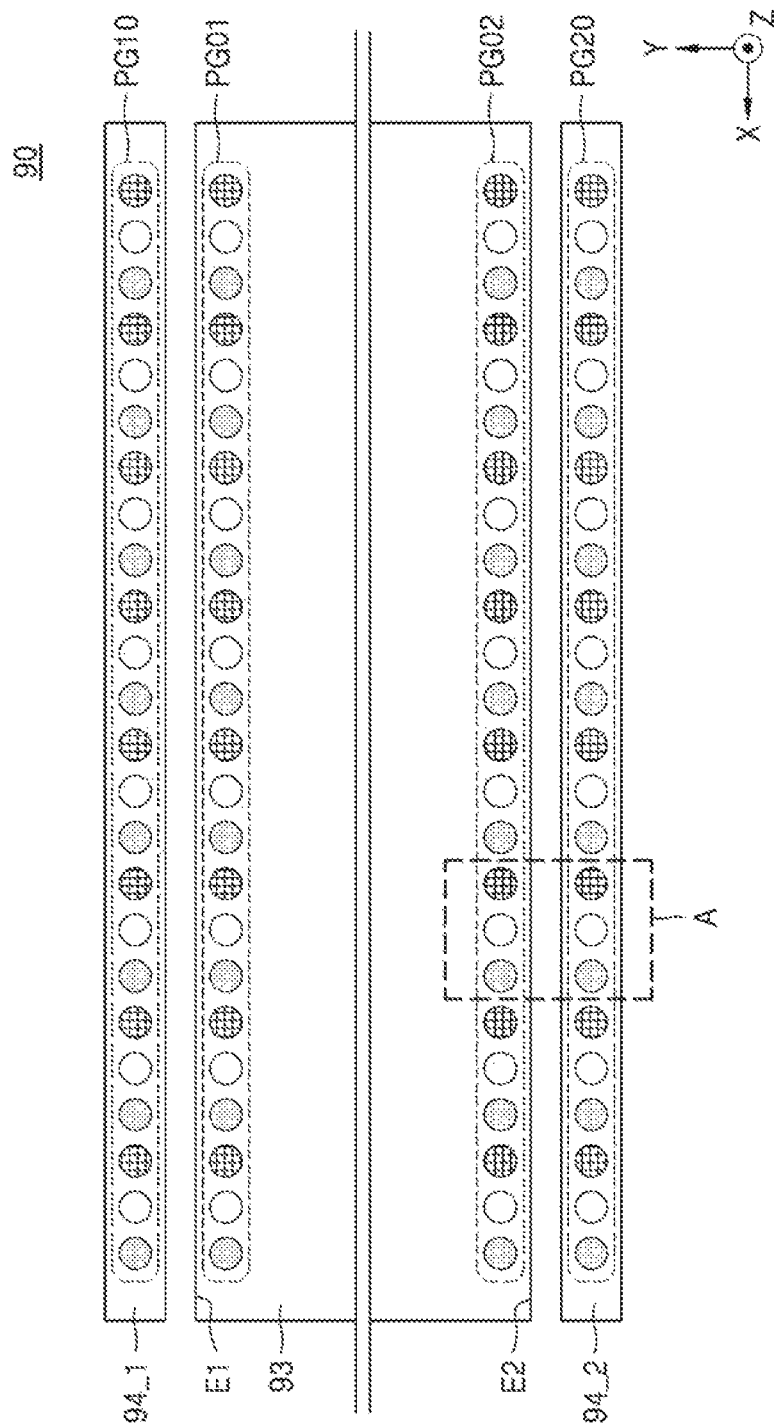
FIG. 9 illustrates an antenna module in accordance with an example embodiment.
Figure 10:
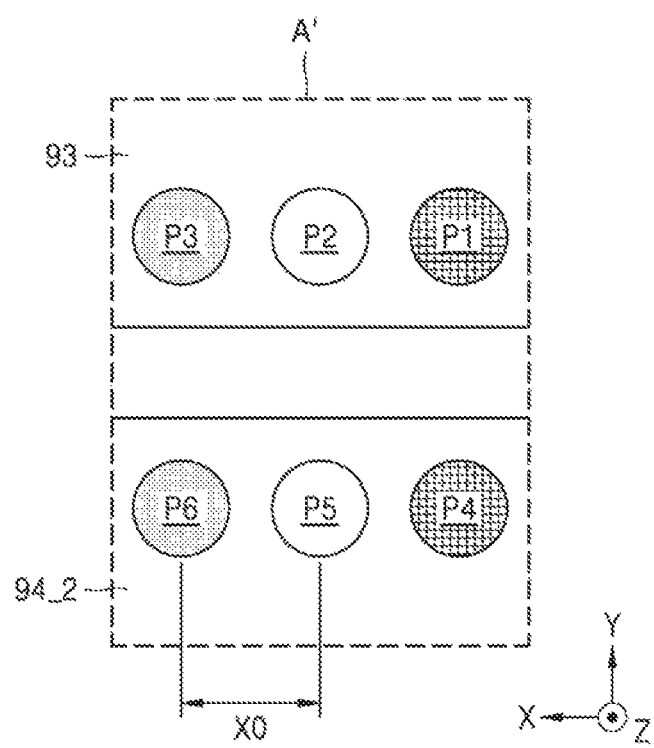
FIG. 10 illustrates an enlarged diagram of an area A of FIG. 9 in accordance with an example embodiment.

FIG. 9 illustrates an antenna module in accordance with an example embodiment, and FIG. 10 illustrates an enlarged diagram of an area A of FIG. 9 in accordance with an example embodiment. Specifically, FIGS. 9 and 10 are top views illustrating an example of the RF chip 73 and the first and second active device arrays 74_1 and 74_2, viewed in the −Z axis direction from the bottom surface of the multilayer board 71 of FIG. 7. Hereinafter, FIGS. 9 and 10 will be described with reference to FIG. 7.

Referring to FIG. 9, an antenna module 90 may include an RF chip 93, a first active device array 94_1 and a second active device array 94_2. The RF chip 93 may include a first group of pins PG01 including pins for connecting to the first active device array 94_1 and a second group of pins PG02 including pins for connecting to the second active device array 94_2. In addition, the first active device array 94_1 may include a plurality of pins PG10 including pins for connecting to the RF chip 93, and the second active device array 94_2 may include a plurality of pins PG20 including pins for connecting to the RF chip 93.

As shown in FIG. 9, the first active device array 94_1 may be adjacent to a first edge E1 of the RF chip 93, and the first group of pins PG01 of the RF chip 93 may be arranged parallel to the first edge E1. The first active device array 94_1 may extend parallel to the first edge E1, and the plurality of pins PG10 of the first active device array 94_1 may also be arranged parallel to the first edge E1. In addition, the second active device array 94_2 may be adjacent to a second edge E2 of the RF chip 93, and the second group of pins PG02 of the RF chip 93 may be arranged parallel to the second edge E2. The second active device array 94_2 may extend parallel to the second edge E2, and the plurality of pins PG20 of the second active device array 94_2 may also be arranged parallel to the second edge E2.

Referring to FIG. 10, pins of the RF chip 93 and pins of the second active device array 94_2 may be spaced apart from each other by the same pitch XO. As described above with reference to FIG. 4A and the like, when the second active device array 94_2 includes a transistor and includes pins connected to electrodes of the transistor, an input pin, a ground pin, and an output pin may be repeated. For example, as shown in FIG. 10, a first pin P1, a second pin P2 and a third pin P3 of the RF chip 93 may respectively correspond to the input pin, the ground pin, and the output pin, and a fourth pin P4, a fifth pin P5, and a sixth pin P6 of the second active device array 94_2 may respectively correspond to the output pin, the ground pin, and the input pin. Alternatively, the first to third pins P1 to P3 of the RF chip 93 may respectively correspond to the output pin, the ground pin, and the input pin, and the fourth to sixth pins P4 to P6 of the second active device array 94_2 may respectively correspond to the input pin, the ground pin, and the output pin. As described below with reference to FIG. 14, the multilayer board (e.g., 71 in the embodiment of FIG. 7) may include patterns for interconnecting the input pins and the output pins of the RF chip 93 and the second active device array 94_2.

Figure 11:
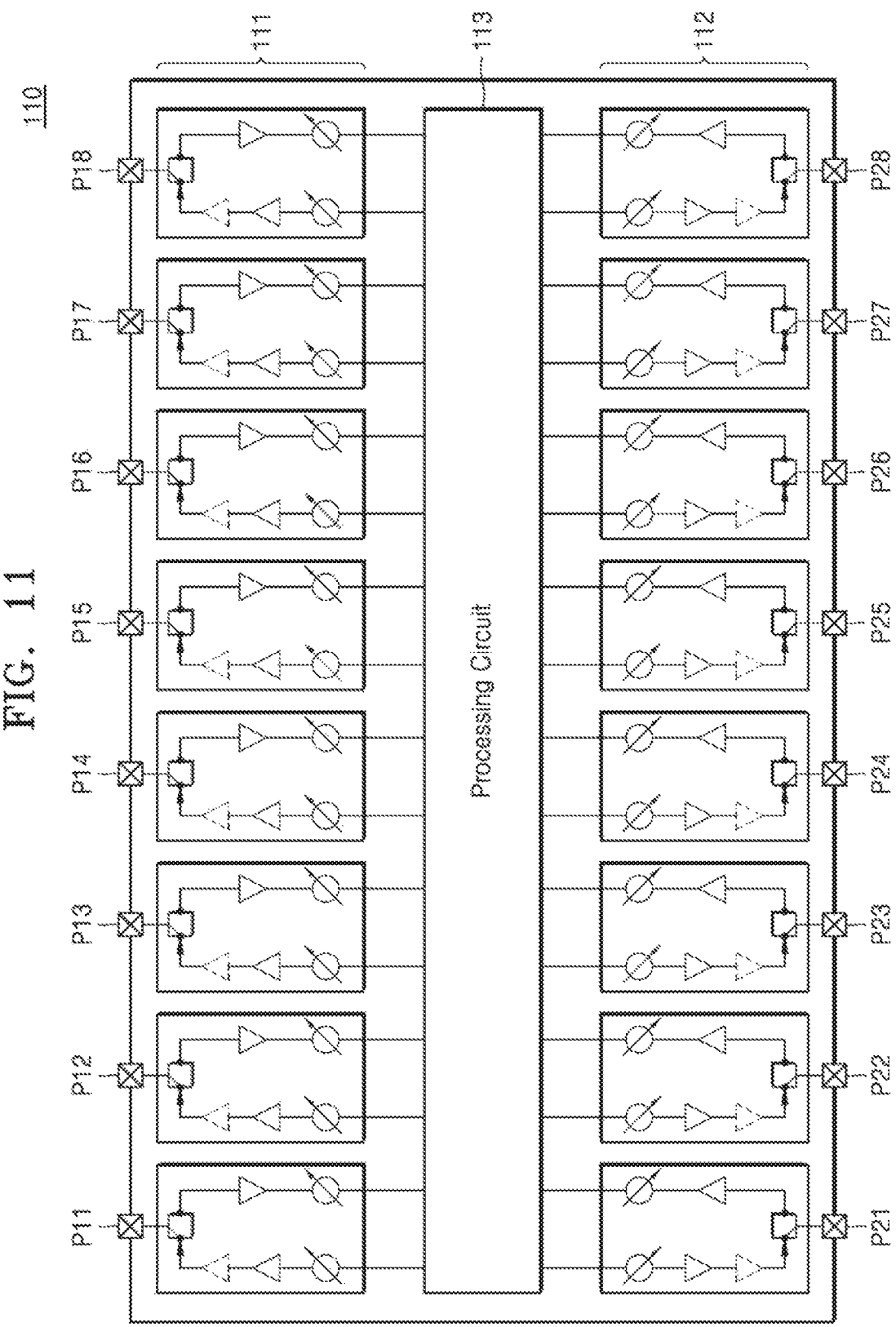
FIGS. 11 and 12 illustrate examples of an RF chip in accordance with an example embodiment.
Figure 12:
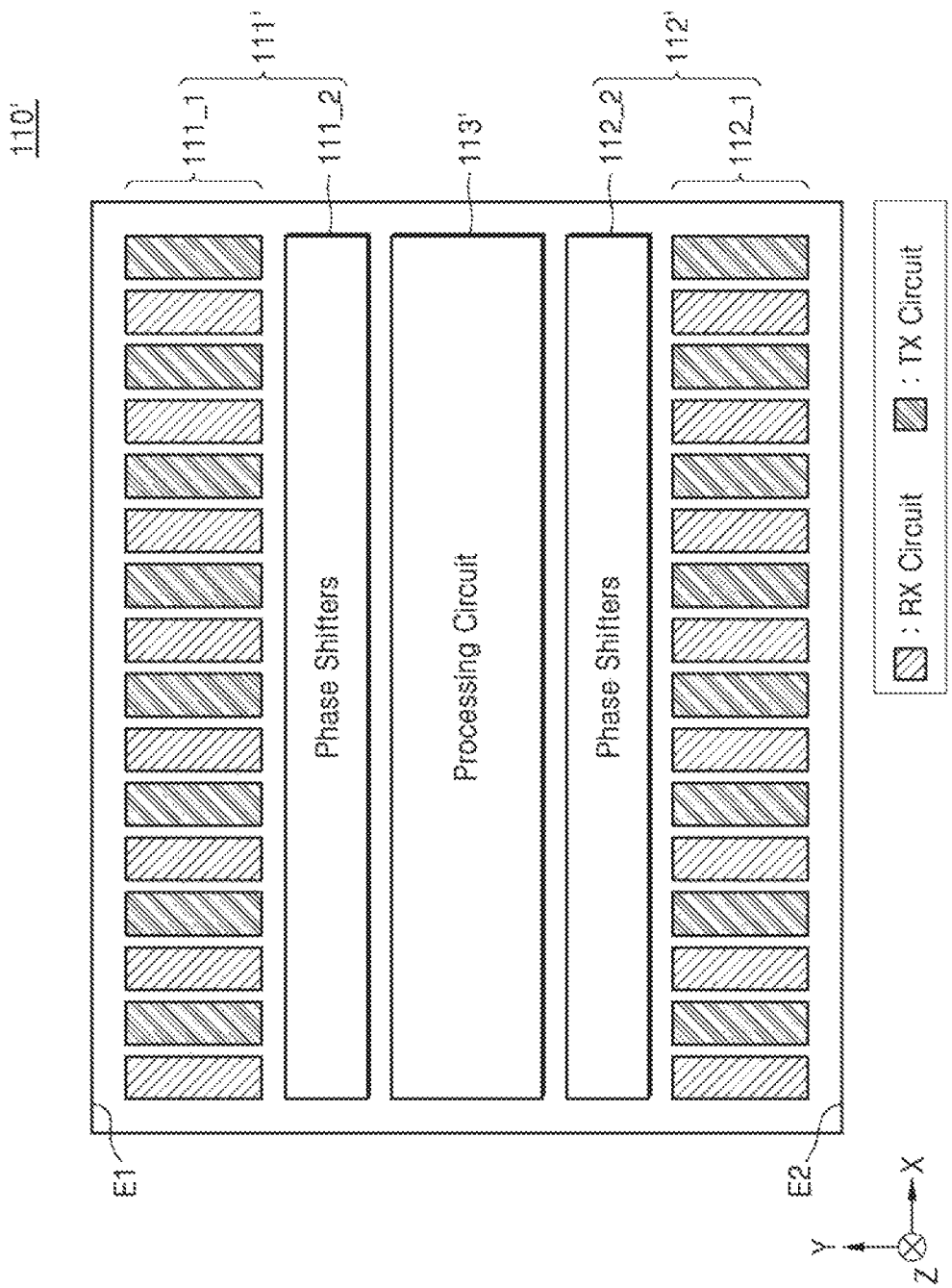

FIGS. 11 and 12 illustrate examples of an RF chip in accordance with an example embodiment. Specifically, FIG. 11 illustrates a block diagram of an RF chip 110 including 16 transmission circuits and 16 reception circuits, and FIG. 12 illustrates an example of a layout of the RF chip 110 of FIG. 11. In some embodiments, similar to that shown in FIG. 7, the RF chip 110 may connect to two active device arrays.

Referring to FIG. 11, the RF chip 110 may include eight first transmission and reception circuits 111, eight second transmission and reception circuits 112, and a processing circuit 113. The first transmission and reception circuits 111 may respectively connect to eight pins P11 to P18 for connecting to antennas, and the second transmission and reception circuits 112 may also respectively connect to eight pins P21 to P28 for connecting to antennas. The processing circuit 113 may be connected to the first transmission and reception circuits 111 and the second transmission and reception circuits 112 and may include switches, combiners/dividers, mixers, local oscillating generators, and the like. As indicated by dashed lines in FIG. 11, some active devices included in the transmission circuit in the RF chip 110 may be omitted, and the RF chip 110 may be connected to an active device array including the omitted active devices.

Referring to FIG. 12, in an RF chip 110', first and second transmission and reception circuits 111' and 112' may be respectively adjacent to first and second edges E1 and E2 of the RF chip 110', and the processing circuit 113' may be between the first and second transmission and reception circuits 111' and 112'. The first transmission and reception circuits 111' may include eight pairs 111_1 of the transmission circuit and the reception circuit, and a phase shifters 111_2. As illustrated in FIG. 12, eight pairs 111_1 of the transmission circuit and the reception circuit may be adjacent to the first edge E1 and arranged parallel to the first edge E1. In addition, the second transmission and reception circuits 113' may include eight pairs 112_1 of the transmission circuit and the reception circuit, and a phase shifters 112_2. As illustrated in FIG. 12, eight pairs 112_1 of the transmission circuit and the reception circuit may be adjacent to the second edge E2 and arranged parallel to the second edge E2.

Figure 13A:
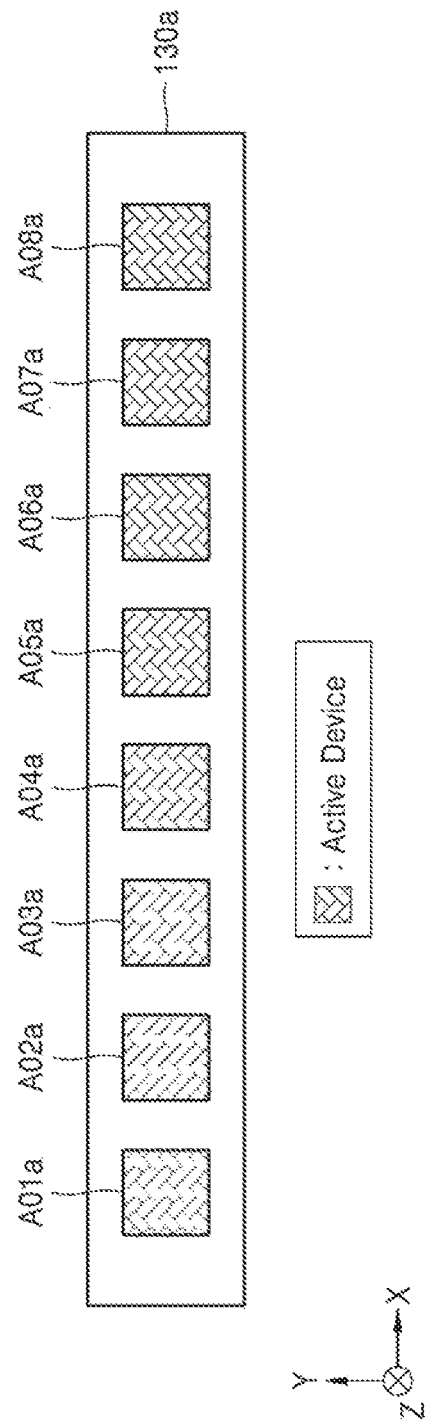
FIGS. 13A and 13B illustrate examples of a layout of an active device array in accordance with example embodiments.
Figure 13B:
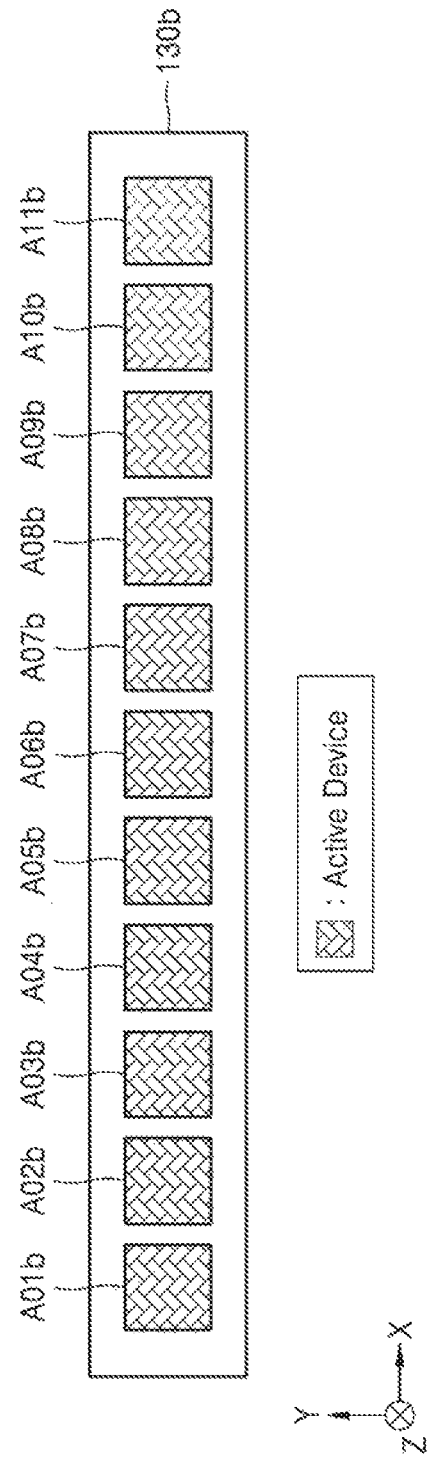

FIGS. 13A and 13B illustrate examples of a layout of an active device array in accordance with example embodiments. In some embodiments, the active device arrays 130a and 130b of FIGS. 13A and 13B, respectively, may be adjacent to the first edge E1 or the second edge E2 of the RF chip 110' of FIG. 12, and may be connected to the RF chip 110'. Hereinafter, FIGS. 13A and 13B will be described with reference to FIG. 12.

Referring to FIG. 13A, an active device array 130a may include first to eighth active devices A01a to A08a. The first to eighth active devices A01a to A08a may be respectively connected to the eight pairs 111_1 (or 112_1) of the transmission circuit and the reception circuit of the first transmission and reception circuits 111' (or 112') of FIG. 12.

Referring to FIG. 13B, an active device array 130b may preliminarily include additional active devices. For example, as shown in FIG. 13B, the active device array 130b may include first to eleventh active devices A01b to A11b. Eight active devices of the first to eleventh active devices A01b to A11b may be respectively connected to the eight pairs 111_1 (or 112_1) of the transmission circuit and the reception circuit of the first transmission and reception circuit 111' (or 112') of FIG. 12, while the remaining three active devices may not be involved in a transmission and reception operation and may be referred to as dummy active devices. For example, the RF chip 110' may include switches (or multiplexers) between the first transmission and reception circuit 111' and pins, and some of the 11 active devices A01b to A11b included in the active device array 130b, that is, eight active devices in this example, may be selected by the switches.

Figure 14:
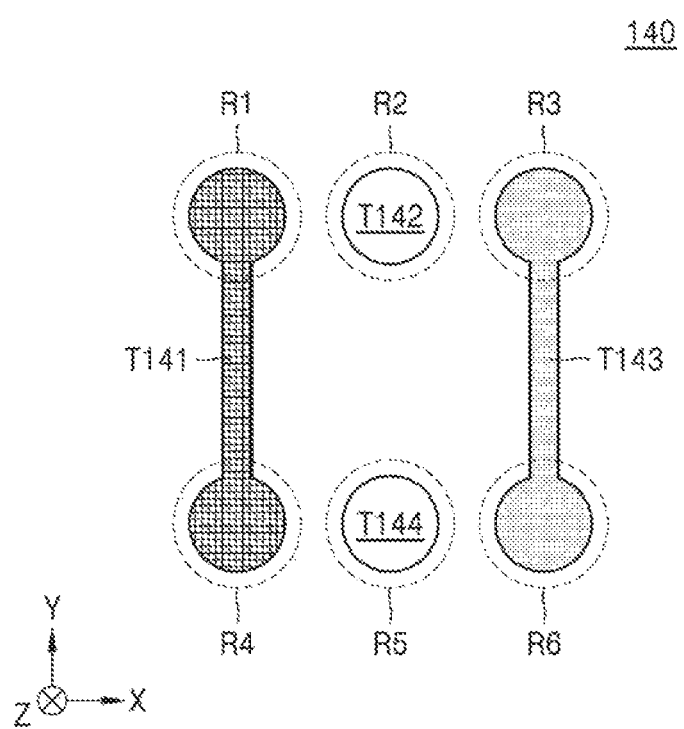
FIG. 14 illustrates a multilayer board in accordance with an example embodiment.

FIG. 14 illustrates a multilayer board in accordance with an example embodiment. In some embodiments, the RF chip 93 and the second active device array 94_2 of FIG. 10 may be disposed on the bottom surface of a multilayer board 140 of FIG. 14, and FIG. 14 shows an example of patterns for the first to sixth pins P1 to P6 in FIG. 10. Hereinafter, FIG. 14 will be described with reference to FIG. 10.

As shown in FIG. 14, the multilayer board 140 may include first to fourth patterns T141 to T144. The first pattern T141 may interconnect the first and fourth pins P1 and P4 of FIG. 10, and the third pattern T143 may interconnect the third and sixth pins P3 and P6 of FIG. 10. In addition, the second pattern T142 may be connected to the second pin P2 of FIG. 10, and the fourth pattern T144 may be connected to the fifth pin P5 of FIG. 10. As described above with reference to FIG. 10, the first to third pins P1 to P3 of the RF chip 93 and the fourth to sixth pins P4 to P6 of the second active device array 94_2 may be spaced apart from each other by the same pitch in the X axis direction, and thus, as shown in FIG. 14, the first and third patterns T141 and T143 may extend parallel to the Y axis and may be arranged along the X axis. In addition, for the connection to the pins, the patterns may include regions exposed to the outside of the multilayer board 140. For example, as illustrated in FIG. 14, the first to fourth patterns T141 to T144 in the first to sixth regions R1 to R6 may be exposed to the outside of the multilayer board 140, and the exposed regions may be referred to as a pad.

Figure 15:
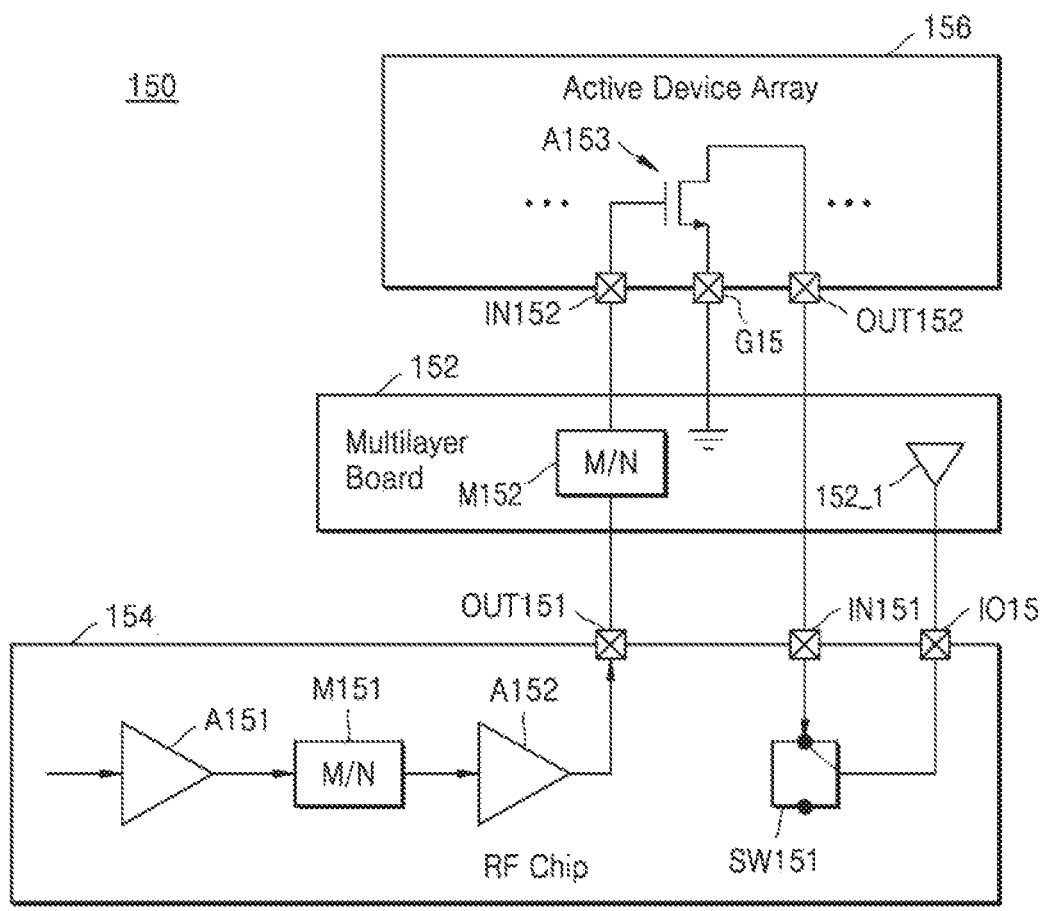
FIG. 15 illustrates an antenna module in accordance with an example embodiment.

FIG. 15 illustrates an antenna module in accordance with an example embodiment. Specifically, FIG. 15 is a block diagram illustrating one antenna and a portion of a transmission circuit constituting a transmission path corresponding to the antenna in an antenna module 150. Compared to the antenna module 40a of FIG. 4A, in the antenna module 150 of FIG. 15, a second matching network (M/N) M152 may be included in a multilayer board 152 instead of included in the RF chip 154. Hereinafter, descriptions overlapping with descriptions of FIG. 4A will be omitted for conciseness.

The RF chip 154 may include a first amplifying circuit A151 and a second amplifying circuit A152, a first matching network (M/N) M151, and a first switch SW151, and may also include a first input pin IN151, a first output pin OUT151, and an input/output pin 1015 connected to the multilayer board 152. An active device array 156 may include a third amplifying circuit A153, and include a second input pin IN152, a second output pin OUT152, and a ground pin G15 connected to the multilayer board 152. The multilayer board 152 may include the second matching network (M/N) M152 as well as the antenna 152_1. Due to the dimension of the multilayer board 152, which is larger than the RF chip 154, the second matching network (M/N) M152 included in the multilayer board 152 may have good characteristics and/or the second matching network (M/N) M152 included in the multilayer board 152 may be easier to design than a matching network (M/N) included in the RF chip 154. Accordingly, the performance and availability of the transmission circuit may be further improved. In some embodiments, differently from that shown in FIG. 15, the RF chip 154 may include an additional matching network between the second amplifying circuit A152 and the second matching network (M/N) M152, and the additional matching network and the second matching network (M/N) M152 may provide matching between the second and third amplifying circuits A152 and A153.

Figure 16:
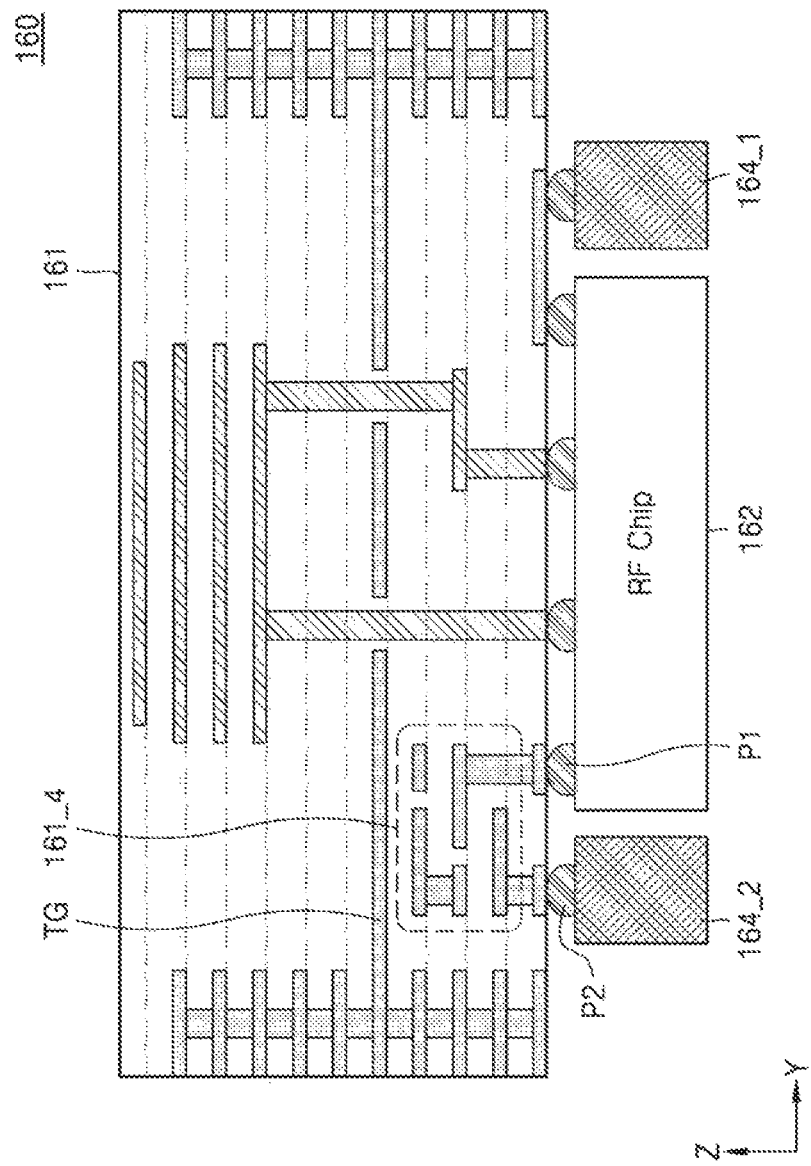
FIG. 16 illustrates an antenna module in accordance with an example embodiment.

FIG. 16 illustrates an antenna module in accordance with an example embodiment. Specifically, as described above with reference to FIG. 15, FIG. 16 illustrates a cross-sectional view of the antenna module 160 including a multilayer board 161 which includes a matching network (M/N) 161_4, as cut in a plane perpendicular to the X axis. As shown in FIG. 16, the antenna module 160 may include the multilayer board 161, an RF chip 162, and a first active array 164_1 and a second active device array 164_2.

The multilayer board 161 may include the matching network (M/N) 161_4 under a ground plate TG, and the RF chip 162 may include a first pin P1 connected to the matching network (M/N) 161_4, and the second active device array 164_2 may also include a second pin P2 connected to the matching network (M/N) 161_4. When the first pin P1 is an input pin, the second pin P2 may be an output pin, and when the first pin P1 is an output pin, the second pin P2 may be an input pin.

Figure 17A:
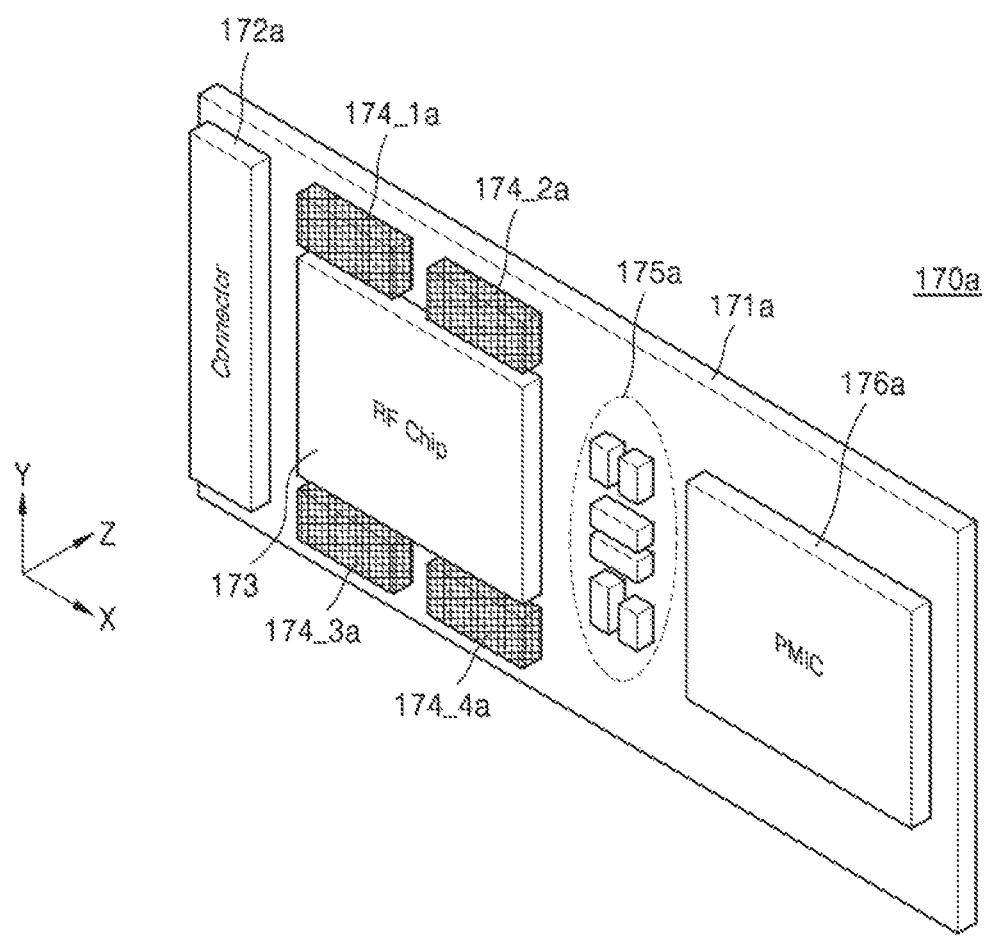
FIGS. 17A to 17C illustrate examples of an antenna module in accordance with example embodiments.
Figure 17B:
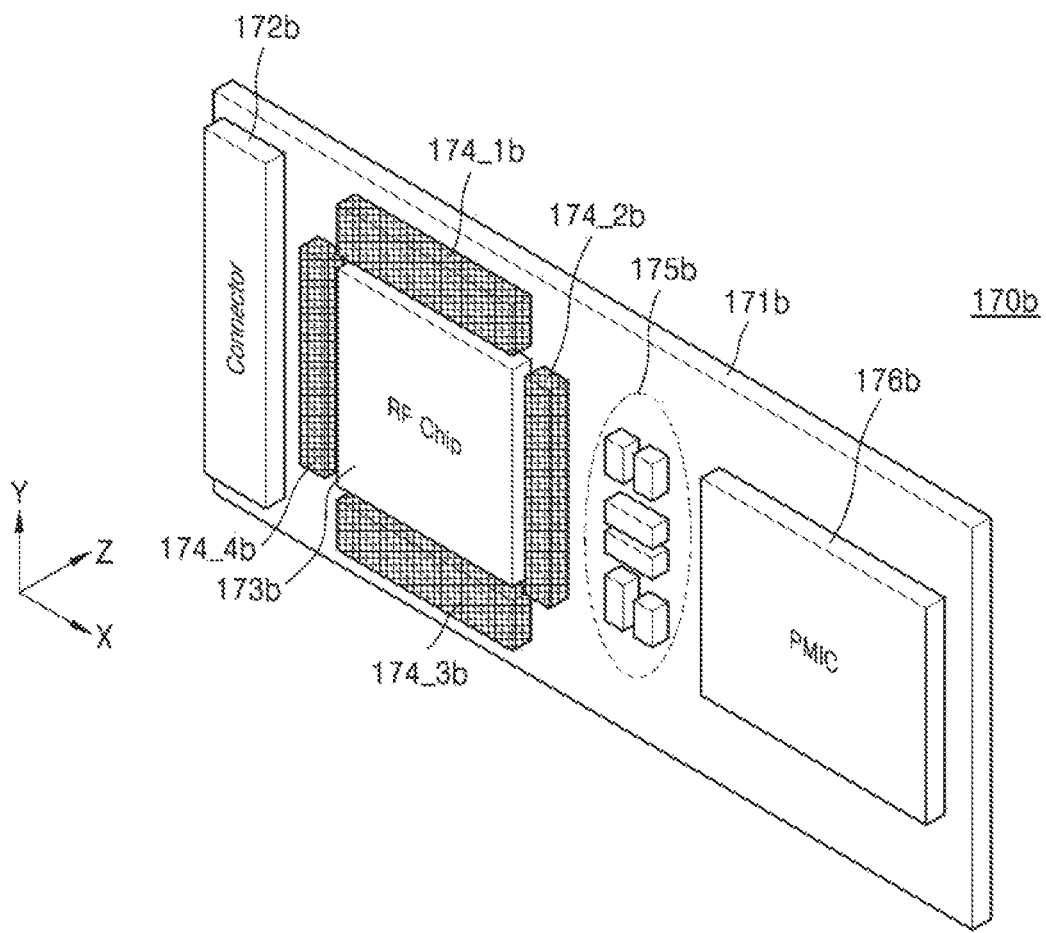
Figure 17C:
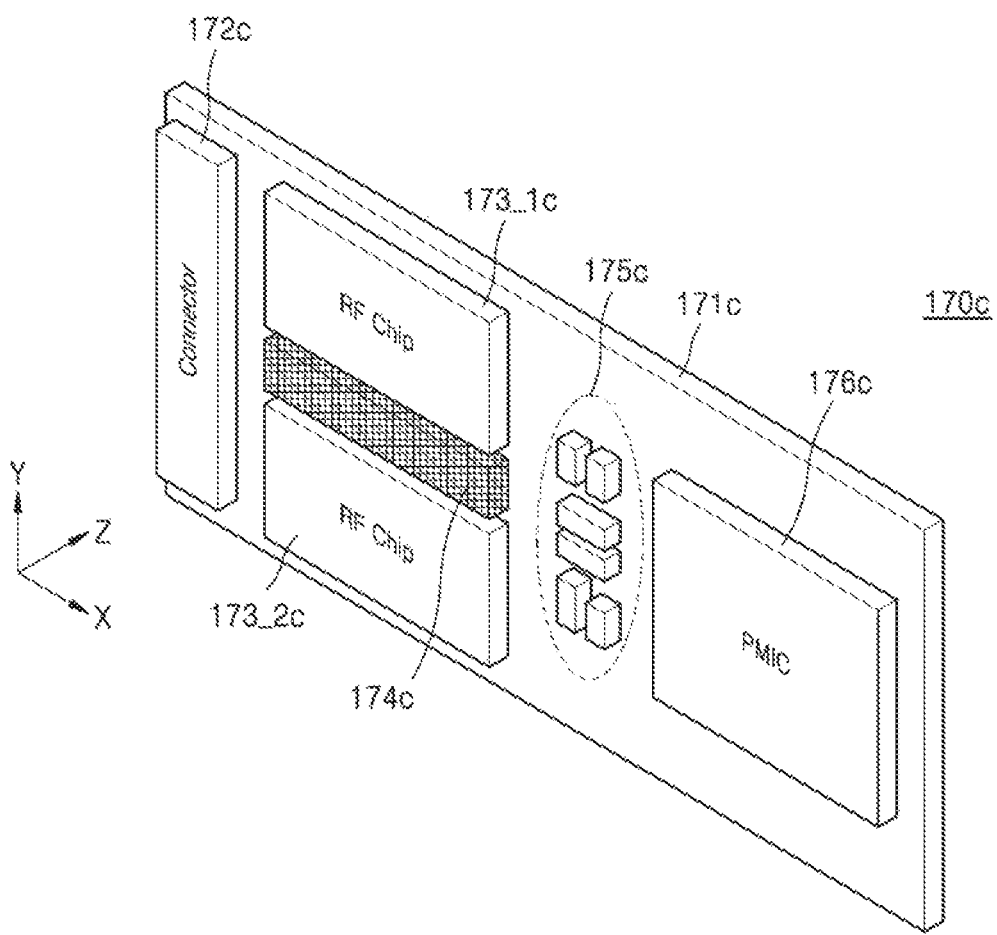

FIGS. 17A to 17C illustrate examples of an antenna module in accordance with example embodiments. Specifically, FIGS. 17A to 17C are perspective views illustrating antenna modules 170a, 170b, 170c, respectively, corresponding to various combinations of an RF chip and an active device array. Hereinafter, descriptions overlapping the description of FIG. 7 will be omitted from the description of FIGS. 17A to 17C for conciseness of description.

Referring to FIG. 17A, the antenna module 170a may include a multilayer board 171a, a connector 172a, an RF chip 173a, first to fourth active device arrays 174_1a to 174_4a, discrete devices 175a, and a PMIC 176a. As shown in FIG. 17A, the first and second active device arrays 174_1a and 174_2a may extend parallel to the X axis, and may be equally spaced apart from one edge of the RF chip 173a in the Y axis direction. Similarly, the third and fourth active device arrays 174_3a and 174_4a may extend parallel to the X axis, and may be equally spaced apart from one edge of the RF chip 173a in the Y axis direction. In some embodiments, the first to fourth active device arrays 174_1a to 174_4a may be the same.

Referring to FIG. 17B, the antenna module 170b may include a multilayer board 171b, a connector 172b, an RF chip 173b, first to fourth active device arrays 174_1b to 174_4b, discrete devices 175b, and a PMIC 176b. As shown in FIG. 17B, the first to fourth active device arrays 174_1b to 174_4b may be adjacent to edges of the RF chip 173b, respectively. In some embodiments, the first to fourth active device arrays 174_1b to 174_4b may be the same.

Referring to FIG. 17C, the antenna module 170c may include a multilayer board 171c, a connector 172c, first and second RF chips 173_1c and 173_2c, an active device array 174c, discrete devices 175c, and a PMIC 176c. In some embodiments, antenna module 170c may include a plurality of RF chips, and the plurality of RF chips may share at least one active device array. For example, as shown in FIG. 17C, the active device array 174c may be between the first and second RF chips 173_1c and 173_2c, and may be respectively connected to the first and second RF chips 173_1c and 173_2c. Accordingly, some active devices included in the active device array 174c may be connected to the first RF chip 173_1c, while other active devices may be connected to the second RF chip 173_2c.

Figure 18:
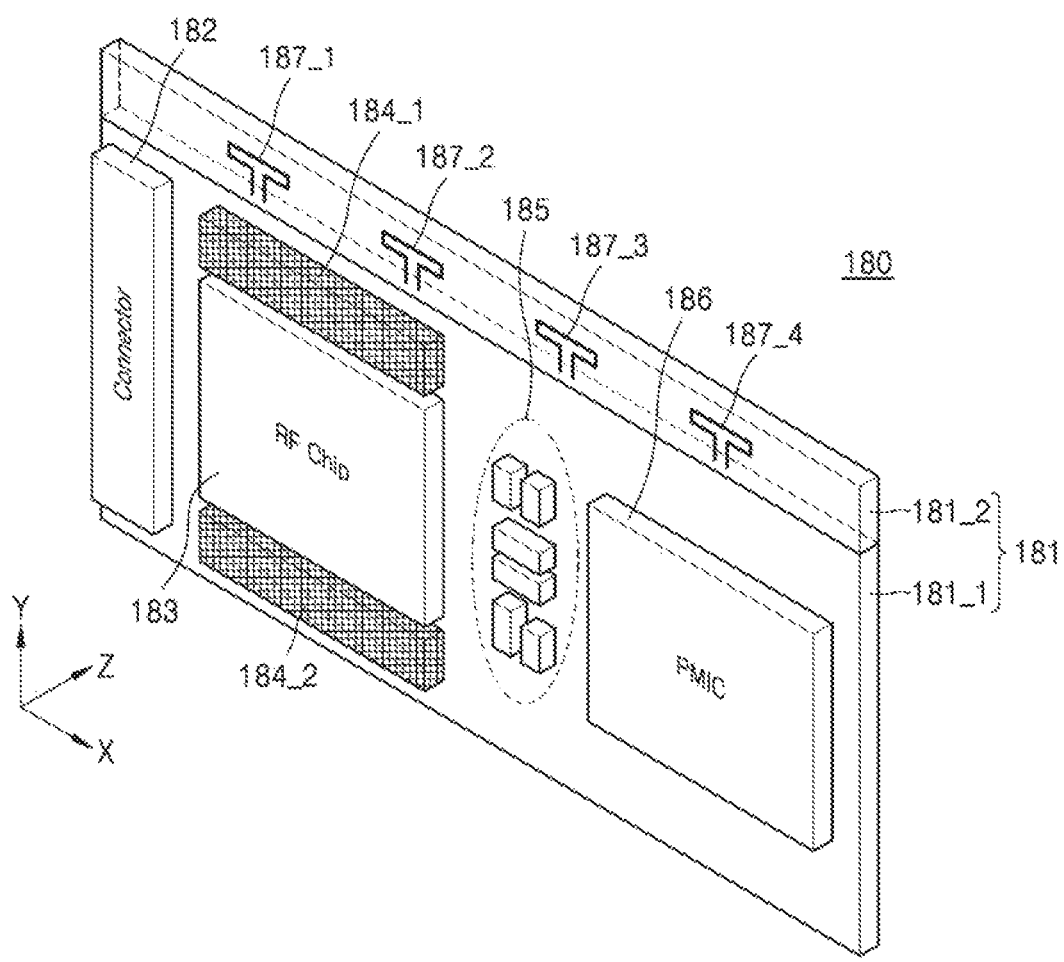
FIG. 18 illustrates an antenna module in accordance with an example embodiment.

FIG. 18 illustrates an antenna module in accordance with an example embodiment. Specifically, FIG. 18 is a perspective view illustrating an antenna module including a dipole antenna. As shown in FIG. 18, the antenna module 180 may include a multilayer board 181, a connector 182, an RF chip 183, first and second active device arrays 184_1 and 184_2, discrete devices 185 and a PMIC 186. Hereinafter, descriptions overlapping with descriptions of FIG. 7 will be omitted for conciseness.

The multilayer board 181 may include first to fourth dipole antennas 187_1 to 187_4. As shown in FIG. 18, the multilayer board 181 may include a first region 181_1 including a patch antenna that may transmit and receive electromagnetic waves through an upper surface of the multilayer board 181, that is, a surface exposed in the +Z axis direction, and a second region 181_2 including the dipole antennas. The connector 182, the RF chip 183, the first and second active device arrays 184_1 and 184_2, the discrete devices 185 and the PMIC 186 may be disposed on a bottom surface of the first region 181_1. The first to fourth dipole antennas 187_1 to 187_4 may be connected to the RF chip 183, and may transmit and receive electromagnetic waves through a side surface of the multilayer board 181, for example, a surface perpendicular to the Y axis. It will be appreciated that the example embodiments are not limited to the shapes and numbers of the first to fourth dipole antennas 187_1 to 187_4 shown in FIG. 18.

While the inventive concept has been particularly shown and described with reference to embodiments thereof, it will be understood that various changes in form and details may be made therein without departing from the spirit and scope of the following claims.

What is claimed is:

1. A radio frequency (RF) chip configured to process an RF signal, the RF chip comprising:
   an input/out pin for connecting to an antenna;
   a first output pin and a first input pin for respectively connecting to electrodes of a first active device included in a first active device array that is separate from the RF chip; and
   a transmission circuit constituting a part of a transmission path for generating the RF signal to be provided to the antenna,
   wherein the transmission path sequentially passes through the first output pin, the first active device, and the first input pin.

2. The RF chip of claim 1, wherein
   the first active device is a transistor included in a power amplifier constituting a part of the transmission path.

3. The RF chip of claim 2, wherein
   the power amplifier is a multi-stage amplifier, and
   the transistor is included in a final stage of the multi-stage amplifier.

4. The RF chip of claim 1, wherein the transmission circuit comprises:
   a first matching network connected to the first output pin and comprising at least one passive device; and
   a second matching network connected to the first input pin and comprising at least one passive device.

5. The RF chip of claim 4, further comprising:
   an interface circuit configured to receive a control signal from outside of the RF chip,
   wherein at least one of the first matching network and the second matching network is tunable according to the control signal.

6. The RF chip of claim 1, wherein
   wherein the first active device is one of a plurality of active devices included in the first active device array,
   the RF chip includes a first group of pins for respectively connecting to electrodes of the plurality of active devices, and
   the first group of pins are arranged parallel to and adjacent to a first edge of the RF chip.

7. The RF chip of claim 6, further comprising:
   a second group of pins for respectively connecting to electrodes of a plurality of active devices included in a second active device array,
   wherein the second group of pins are arranged parallel to and adjacent to a second edge of the RF chip opposite the first edge.

8. The RF chip of claim 7, comprising:
   a plurality of the transmission circuits, each constituting a part of each of a plurality of transmission paths,
   wherein a first portion of the plurality of the transmission circuits are arranged parallel to and adjacent to the first edge, and
   a second portion of the plurality of the transmission circuits are arranged parallel to and adjacent to the second edge.

9. The RF chip of claim 1, wherein
   the transmission circuit includes active devices and passive devices implemented by a complementary metal oxide semiconductor (CMOS) process.

10. The RF chip of claim 1, further comprising:
    a second output pin and a second input pin for respectively connecting to electrodes of a second active device included in the first active device array,
    wherein the transmission path sequentially passes through the second output pin, the second active device, the second input pin, and the first output pin.

11. A radio frequency (RF) chip configured to process an RF signal, the RF chip comprising:
    an input/out pin for connecting to an antenna;
    a first output pin and a first input pin for respectively connecting to electrodes of a first active device included in a first active device array; and
    a transmission circuit constituting a part of a transmission path for generating the RF signal to be provided to the antenna,
    wherein the transmission path sequentially passes through the first output pin, the first active device, and the first input pin,
    wherein the RF chip further comprises:
    a second output pin and a second input pin for respectively connecting to electrodes of a second active device included in the first active device array or in a second active device array, and
    a reception circuit constituting a part of a reception path for processing the RF signal received from the antenna,
    wherein the reception path sequentially passes through the second output pin, the second active device, and the second input pin.

12. The RF chip of claim 11, wherein
    the second active device is a transistor included in a low noise amplifier constituting a part of the reception path.

13. The RF chip of claim 12, wherein
    the low noise amplifier is a multi-stage amplifier, and
    the transistor is included in an initial stage of the multi-stage amplifier.

14. The RF chip of claim 13, further comprising:
    a third output pin and a third input pin for respectively connecting to electrodes of a third active device included in the first active device array or in the second active device array, and
    wherein the reception path sequentially passes through the second input pin, the third output pin, the third active device, and the third input pin.

15. The RF chip of claim 11, wherein the reception circuit comprises:
    a first matching network connected to the second output pin and comprising at least one passive device; and
    a second matching network connected to the second input pin and comprising at least one passive device.

* * * * *